(12) United States Patent
Matsui et al.

(10) Patent No.: US 7,344,296 B2
(45) Date of Patent: Mar. 18, 2008

(54) SOCKET FOR LED LIGHT SOURCE AND LIGHTING SYSTEM USING THE SOCKET

(75) Inventors: Nobuyuki Matsui, Takatsuki (JP); Masanori Shimizu, Kyotanabe (JP); Kazuhisa Matsuo, Machida (JP); Eiji Kawabe, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 217 days.

(21) Appl. No.: 10/543,635

(22) PCT Filed: Feb. 2, 2004

(86) PCT No.: PCT/JP2004/001008

§ 371 (c)(1),
(2), (4) Date: Jul. 28, 2005

(87) PCT Pub. No.: WO2004/071143

PCT Pub. Date: Aug. 19, 2004

(65) Prior Publication Data

US 2006/0141851 A1  Jun. 29, 2006

(30) Foreign Application Priority Data

Feb. 7, 2003  (JP)  ............................. 2003-031701
Feb. 13, 2003  (JP)  ............................. 2003-035378

(51) Int. Cl.
*H01R 33/00*  (2006.01)
*F21V 21/00*  (2006.01)
*F21V 29/00*  (2006.01)

(52) U.S. Cl. ...................... 362/652; 362/800; 362/646; 362/249; 362/371; 362/373

(58) Field of Classification Search ................ 362/249, 362/294, 373, 437–440, 427, 800, 640, 646, 362/647, 652, 655–659, 580, 547, 126, 218, 362/264, 345, 362, 369, 370, 371, 418, 449, 362/429, 430, 548, 250; 257/712, 718, 719; 361/688, 704, 715; 439/946, 490; 312/223.5
See application file for complete search history.

(56) References Cited

U.S. PATENT DOCUMENTS 5,430,627 A * 7/1995 Nagano ...................... 362/146

(Continued)

FOREIGN PATENT DOCUMENTS

DE   199 17 401 A1   4/1999

(Continued)

*Primary Examiner*—John Anthony Ward
*Assistant Examiner*—David Crowe

(57) ABSTRACT

A socket fixed to a heat sink holds a card-type LED module formed by integrating LED elements. The socket (6) includes: a frame structure for holding the LED module (1000) with its light source unit exposed through the frame opening; and a pressing member positioned around the opening for pressing the back surface of the LED module against the heat sink (2122). The socket may include a structure including a lower member (61) placed on a heat sink and an upper frame member (62) holding the LED module with its light source unit (1002) exposed through the frame opening. The upper member supported by the lower member via a hinge can open/close, and includes a pressing unit pressing the LED module set in the open state, against the lower member (61). The lower member (61) includes, in its main part, a lock unit (63) directly or indirectly lock the upper member (62) when the upper member is closed.

22 Claims, 16 Drawing Sheets

U.S. PATENT DOCUMENTS

| | | |
|---|---|---|
| 5,528,474 A | 6/1996 | Roney et al. |
| 5,857,767 A | 1/1999 | Hochstein |
| 6,227,893 B1 | 5/2001 | Kaneko |
| 6,338,650 B1 | 1/2002 | Dong |
| 6,641,284 B2 * | 11/2003 | Stopa et al. ............... 362/240 |
| 6,776,504 B2 * | 8/2004 | Sloan et al. ............... 362/240 |
| 2003/0048641 A1 * | 3/2003 | Alexanderson et al. ..... 362/470 |

FOREIGN PATENT DOCUMENTS

| | | |
|---|---|---|
| EP | 1 081 426 A2 | 8/2000 |
| EP | 1 182 396 A1 | 8/2001 |
| JP | 49-10118 | 3/1974 |
| JP | S62-8403 | 7/1985 |
| JP | 62-211973 | 9/1987 |
| JP | 62-287649 | 12/1987 |
| JP | 1-232383 | 9/1989 |
| JP | 3-1082 | 1/1991 |
| JP | 3-51891 | 5/1991 |
| JP | H3-63950 | 6/1991 |
| JP | 05113759 A * | 5/1993 |
| JP | 11-161742 | 6/1999 |
| JP | 11-177147 | 7/1999 |
| JP | 11-329581 | 11/1999 |
| WO | 99/57945 | 11/1999 |

* cited by examiner

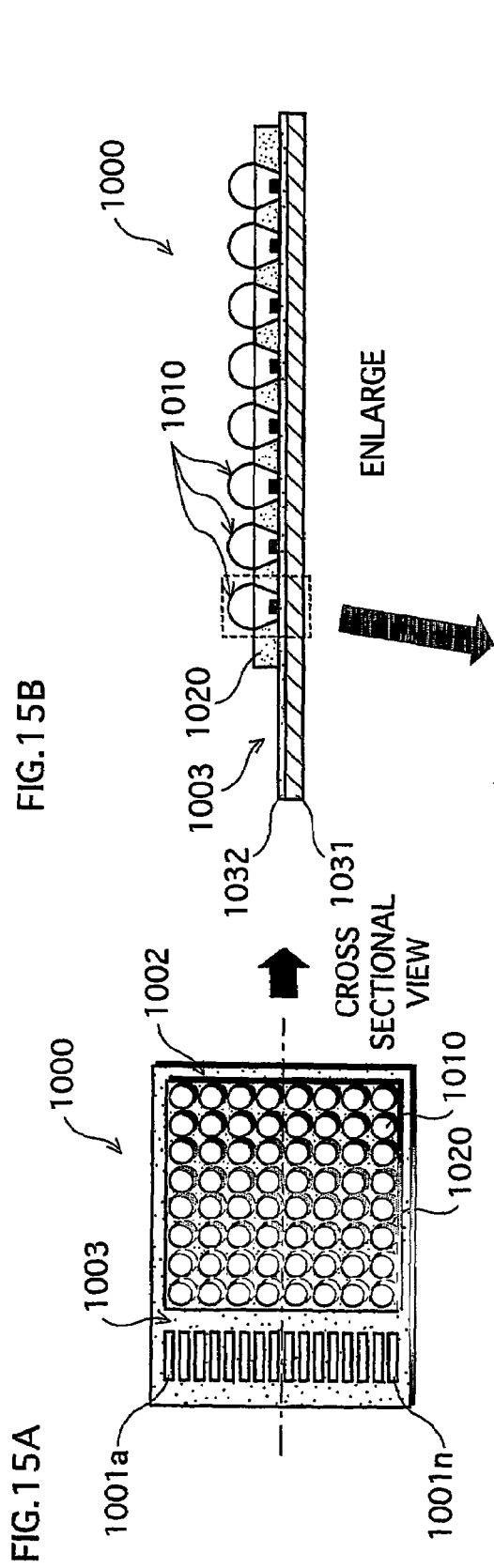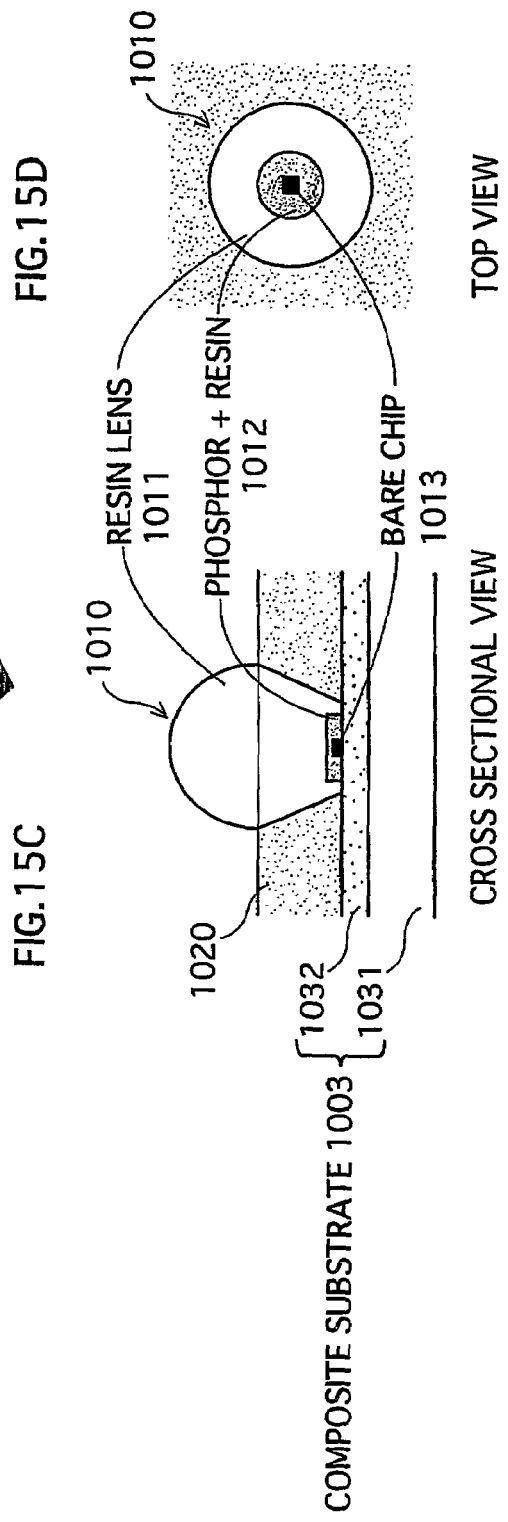

SOCKET FOR LED LIGHT SOURCE AND LIGHTING SYSTEM USING THE SOCKET

TECHNICAL FIELD

The present invention relates to a socket designed for an LED light source for lighting applications, and in particular relates to a socket suitable for a card-type LED module formed by mounting LED bare chips on a metal substrate, and to a lighting system using the socket.

BACKGROUND ART

LED (light emitting diode) light sources are now calling attentions as next-generation new light sources. Unlike typical conventional light sources, LEDs do not use a filament and therefore have a long life. Further, LEDs have a number of advantageous features such as compact manufacturing due to its extremely small and thin dimensions. A wide range of lighting applications are expected for LEDs as light sources, with its favorable features including reduced limitations on the mounting position.

As one example, Japanese Laid-Open Patent Application No. S62-8403 discloses a lighting system that uses an LED light source formed by arranging linear lead frames in parallel, with each lead frame holding a plurality of through-hole type LED elements. Further, one technique is available for removably mounting such an LED light source as a "card-type LED module". The "card-type LED module" is formed by arranging, instead of the lead wires, surface-mounting-type LED elements in parallel on a card-type substrate. This technique enables, on a main substrate where the socket is placed, various card-type LED modules each differing in color and illuminance of emitted light to be selectively mounted depending on the situation.

A card-type LED module formed by mounting a large number of LED bare chips on a metal base substrate has recently been developed. This card-type LED module is expected to have a higher illuminance by future research and development efforts in improving the luminous efficiency of LED bare chips, improving the packing density, and the like.

As one example, such a card-type LED module can be used as a light source for a lighting system by fixing the LED module to a lighting system 2000 using a socket 2020, according to a prior art technique shown in FIG. 16.

The lighting system 2000 shown in FIG. 16 is roughly composed of a base 2001 to be screwed into a socket designed for general-purpose incandescent lamps, and a case 2002 on which a card-type LED module (LED card 1000) can be mounted.

The case 2002 has the socket 2020 for holding the LED card 1000, at its bottom surface facing the surface where the base 2001 is attached.

The socket 2020 has grooves 2021 in which side parts 1000a and 1000b of the LED card 1000 can be engaged. The user mounts the LED card 1000 by inserting the side parts 1000a and 1000b of the LED card 1000 into the grooves 2021 of the socket 2020, and sliding the LED card 1000 from the peripheral part to the central part of the socket 2020. In lighting systems, a light source is usually to be positioned at the center. In the lighting system 2000 with the above-described construction, therefore, the LED card 1000 is to be slid to a predetermined position along the grooves 2021 of the socket 2020, so that the LED card 1000 as its light source is positioned at the center.

The LED light sources for lighting applications will be required to have a higher illuminance in the future. To meet such a requirement, efforts are being made toward higher integration of LEDs and a larger driving current for the LEDs. These efforts are encountered with the following problem.

The higher integration and larger driving current can increase an amount of light emitted by an LED light source. In proportion to the increase, an amount of heat generated in the LED light source also increases. It is generally recognized that an amount of heat generated in the LED light source is relatively small as compared with other typical light sources, but an amount of heat generated in such a card-type LED having a construction where a large number of LED elements are integrated is beyond a negligible level. With serving as a light source for lighting applications, LEDs included in the LED light source may be required to be lit for long hours. The amount of heat generated in the LEDs is inevitably large. In particular, an illuminance of light emitted from LEDs depends on their temperature characteristics. This means that some LEDs may fail to produce a desired illuminance under high-temperature conditions. Also, a plurality of LEDs of different colors may have different temperature characteristics. If these LEDs having different temperature characteristics are, combined for use as a light source, controlling of color emitted from the light source becomes difficult.

When a card-type LED module is inserted into a socket, heat generated from each LED included in the card-type LED module is trapped in the vicinity of the socket. Such significant concentration of heat in one area is problematic. In view of this, a card-type LED module is required to have good heat-releasing properties.

This requirement for good heat-releasing properties also applies to the lighting system 2000 shown in FIG. 16. To be specific, the LED card 1000 is also required to have further improved heat-releasing properties when the socket 2020 described above is used.

Another problem to be solved is a difficulty in the replacement operation of the LED card 1000.

To remove the LED card 1000 from the lighting system 2000 for such reasons as its life being expired, the user is required to slide the LED card 1000 along the grooves 2021 from the central part toward the peripheral part of the case 2002. This removing operation can be difficult for the user because the lighting system 2000 is often placed in an area of limited accessibility such as on the ceiling. In particular, if the user tries to remove the LED card 1000 by uncomfortable body positioning such as stretching his or her arms or bending his or her body, the side parts 1000a and 1000b of the LED card 1000 may get stuck in the grooves 2021, thereby increasing the burden on the user involved in the replacement operation. Accordingly, the lighting system 2000 needs to be improved to enable an easy replacement operation of the LED card 1000.

In the lighting system 2000, a longer distance by which the LED card 1000 is to be slid from the central part toward the peripheral part of the case 2002 not only makes the replacement operation difficult as described above, but also degrades the appearance of the lighting system, with its construction being such that the grooves 2021 extend from the light source unit to the peripheral part of the case 2002.

To solve this problem, the lighting system may be constructed such that the socket 2020 is projected from the surface of the case 2002 so that the LED card 1000 can be placed at such a position that allows easy access by the user. In this case, however, the projected part may drastically degrade the appearance of the lighting system. For the lighting system 2000, a recessed part may be formed in the surface of the case 2002, and the socket 2020 may be placed in the recessed part, so that the socket 2020 holding the LED card 1000 is not projected. However, simply employing such a constructing may further complicate the replacement operation of the LED card 1000.

As described above, sockets designed for card-type LED modules for practical use and lighting systems using the LED modules as light sources still require improvements.

DISCLOSURE OF THE INVENTION

In view of the above problems, the object of the present invention is to provide an LED light-source socket suitable for practical use that enables stable driving while effectively releasing heat generated in each LED during driving, and also to provide a lighting system having the socket without disfigurement of the lighting system.

The above object of the present invention can be achieved by a socket that holds a card-type LED module and is fixed to a heat sink, the LED module having a light source unit on a main surface thereof, the light source unit being formed by integrated LED elements, the socket including a frame structure that holds the LED module in a state where the light source unit is exposed through an opening of the frame structure, and that presses, at a position close to the opening, the LED module to enable a back surface of the LED module to be pressed against a surface of the heat sink.

According to this construction, the card-type LED module held by the socket can also be pressed against the heat sink particularly at edge parts of the light source unit. This ensures that the back surface of the LED module comes in contact with the heat sink. As a result of this, heat generated in the LED module is favorably conducted to the heat sink. Therefore, LEDs can be lit without increasing their temperatures. Accordingly, even LEDs having poor high temperature characteristics can produce a high illuminance, thereby realizing stable driving of the LEDs.

Also, the frame structure may include a pressing member that has elasticity and is at such a position facing the LED module on a back surface of the frame structure.

According to this construction, the LED module can come in direct contact with the heat sink in a state where the LED module is covered by the socket. Therefore, a high heat-releasing effect can be produced. Further, the elastic pressing member provided in the socket securely presses the LED module against the heat sink. Therefore, heat generated in the LED module can be effectively released from the back surface of the LED module. In this case, a desired pressure can be obtained by adjusting the elasticity of the elastic pressing member.

Also, the pressing member may be formed integrally as a part of the frame structure.

By forming the elastic pressing member integrally as a part of the frame structure in this way, the number of components can be reduced, thereby being advantageous in reducing the manufacturing cost.

Also, the frame structure may have a slot area through which the LED module is removably inserted therein, and a cutout area that is formed to spatially connect the slot area and the opening, for guiding the light source unit to the opening when the LED module is inserted.

According to this construction, the LED module can be easily mounted on and removed from the socket that has been fixed to the heat sink. Therefore, the socket provides practically high convenience.

Also, the frame structure may include a lower frame-part and an upper frame-part, the lower frame-part coming in contact with the heat sink, the upper frame-part being a frame for holding the LED module and being fixed to the lower frame-part, and include a pressing member that has elasticity and is provided on the upper frame-part, and the pressing member may press the LED module against a surface of the lower frame-part, and the lower frame-part may be fixed in contact with the surface of the heat sink.

According to this construction, the LED module is indirectly pressed against the heat sink via the lower member. Heat generated in the LED module is still favorably conducted to the heat sink. As a result of this, a high heat-releasing effect can be produced. Further, the socket having this construction also has an advantage that the LED module can be easily mounted on and removed from the socket even after the lower member is fixed to the heat sink.

Here, the lower frame-part and the upper frame-part may be made of brass or stainless steel.

Also, a pressure applied by at least the pressing member to the LED module may be in a range of 0.05 to 1.00 kg/cm$^2$ inclusive. This range corresponds to pressures ranging from 0.3 to 6.7 kg applied to the LED module overall. This range of pressures is determined by considering the optimum pressing effect and the mechanical strength of the substrate used for the LED module.

Also, a feeding terminal may be provided at a position facing the LED module on the frame structure, the feeding terminal may include a plurality of contacts made of phosphor bronze, and an elastic force of the contacts may press the LED module against the heat sink.

Also, the socket may be fixed to the heat sink via a screw. This method is preferable because the LED module can be mounted on and removed from the socket relatively easily. Further, this method is advantageous in that the pressure applied by the socket to the LED module can be adjusted by changing an amount by which the screw is screwed.

The above object of the present invention can also be achieved by a socket that holds a card-type LED module and is fixed to a heat sink, the LED module having a light source unit on a main surface thereof, the LED module being formed by integrated LED elements, the socket including a frame structure including a lower frame-part and an upper frame-part, the lower frame-part being placed on the heat sink, the upper frame-part being a frame holding the LED module in a state where the light source unit is exposed through an opening of the frame, wherein the upper frame-part is supported by the lower frame-part via a hinge in such a manner that the upper frame-part can be open and closed, the upper frame-part includes a pressing unit for pressing the LED module against the lower frame-part, and the lower frame-part includes, in a main part thereof, a lock unit for directly or indirectly locking the upper frame-part when the upper frame-part is closed.

According to this construction, the LED module can be pressed against the lower member when the upper member is locked on the lower member by the lock unit. Therefore, heat generated in the LED module can be effectively released to the lower member or to the heat sink. Also, due to the lock unit, the LED module can be easily removed simply by swaying the upper member, thereby drastically improving the replacement operability and the like, as compared with conventional cases. Further, a recessed part may be provided in the case in the lighting system and the LED module may be placed within the recessed part. By doing so, the LED module can be mounted on or removed from the socket by swaying the upper member, without requiring a case to be projected from the heat sink. Accordingly, the lighting system with high operability and beautiful finish can be realized.

Here, the upper frame-part may include a base part and a pair of arm parts, the base part being supported on an axis in an area where the upper frame-part is supported by the lower frame-part, the pair of arm parts respectively extending from both ends of the base part, the arm parts may have grooves formed at facing positions thereof, for guiding edge parts of the LED module in a longitudinal direction of the arm parts, and the pressing unit of the upper frame-part may be formed within the grooves to press the edge parts of the LED module against the lower frame-part in a state where the LED module is held in the grooves.

Further, an opening may be formed in the main part of the lower frame-part for enabling a base surface of the LED module to face the heat sink.

According to this construction, the LED module and the heat sink can directly face each other. Therefore, the heat-releasing effect can be improved further.

Here, the lock unit in the main part of the lower frame-part may have a slide part placed to be slidable in a longitudinal direction of the arm parts when the upper frame-part is closed, and the slide part may lock edges of the LED module held by the arm parts when the upper frame-part is closed, thereby the upper frame-part is indirectly locked.

Alternatively, the lock unit may be supported on an axis in a freely swayable manner, at a position opposite to a position of the hinge between the lower frame-part and the upper frame-part, and the lock unit may sway toward the upper frame-part when the upper frame-part is closed, thereby the upper frame-part is directly locked on the lower frame-part.

By operating the lock unit with the sliding method or with the swaying method in this way, the LED module can be easily and securely mounted on and removed from the socket.

Also, the lower frame-part may have, in the main part, a projection for aligning the LED module.

By using the alignment projection in this way, the LED module can be directly mounted within the lower member at the time of replacement of the LED module, thereby further improving the replacement operability.

Also, the pressing unit may be formed integrally as a part of the upper frame-part by processing the part of the upper frame-part.

By forming the pressing member integrally as a part of the upper member in this way, the number of components can be reduced, thereby being advantageous in reducing the manufacturing cost.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIGS. 15A to 15C show the construction of a card-type LED module (LED card)

BEST MODE FOR CARRYING OUT THE INVENTION

1. First Embodiment 1.1 Construction of the Socket for LED Light Source

Figure 1:
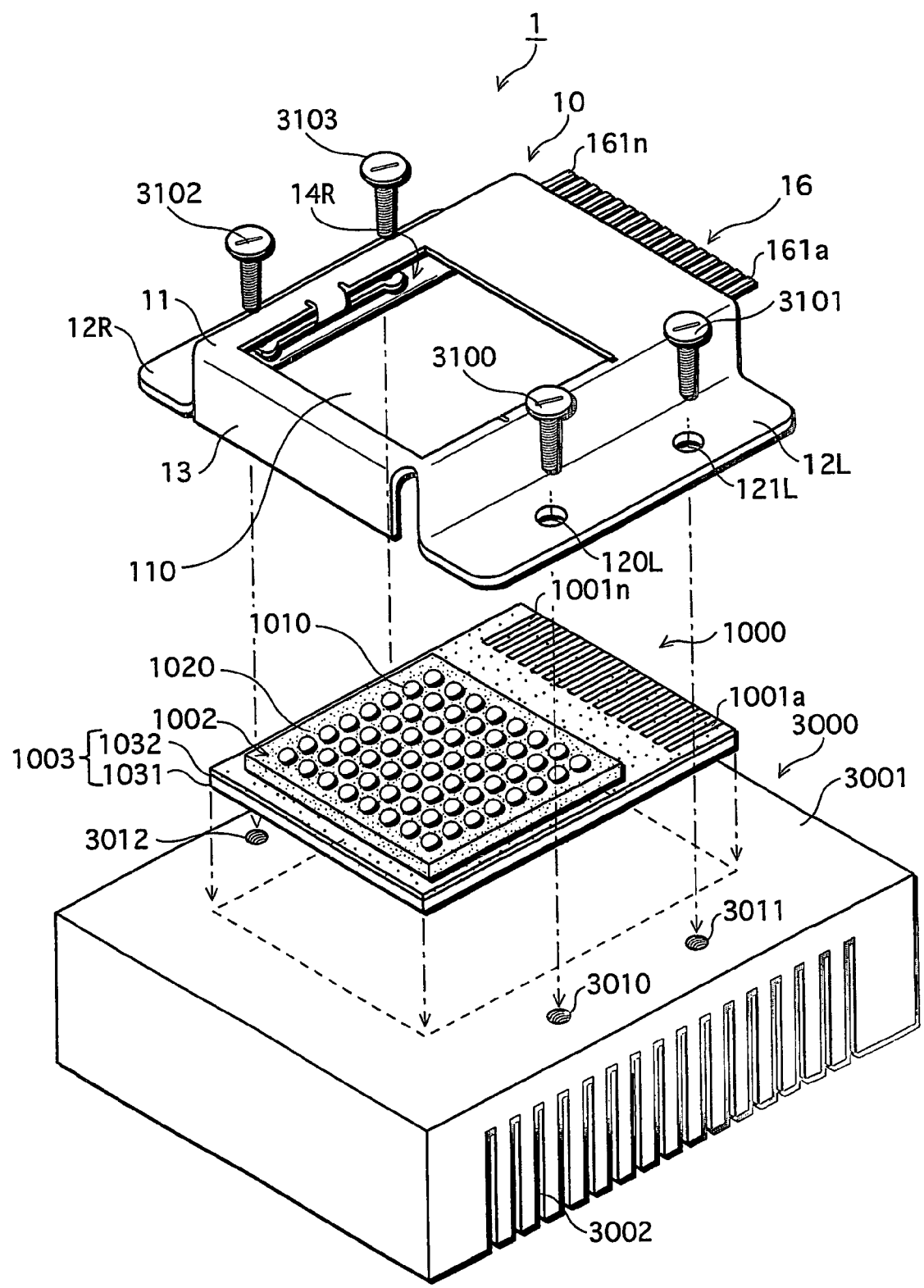
FIG. 1 shows the construction of an LED light-source socket relating to a first embodiment of the present invention.
Figure 2:
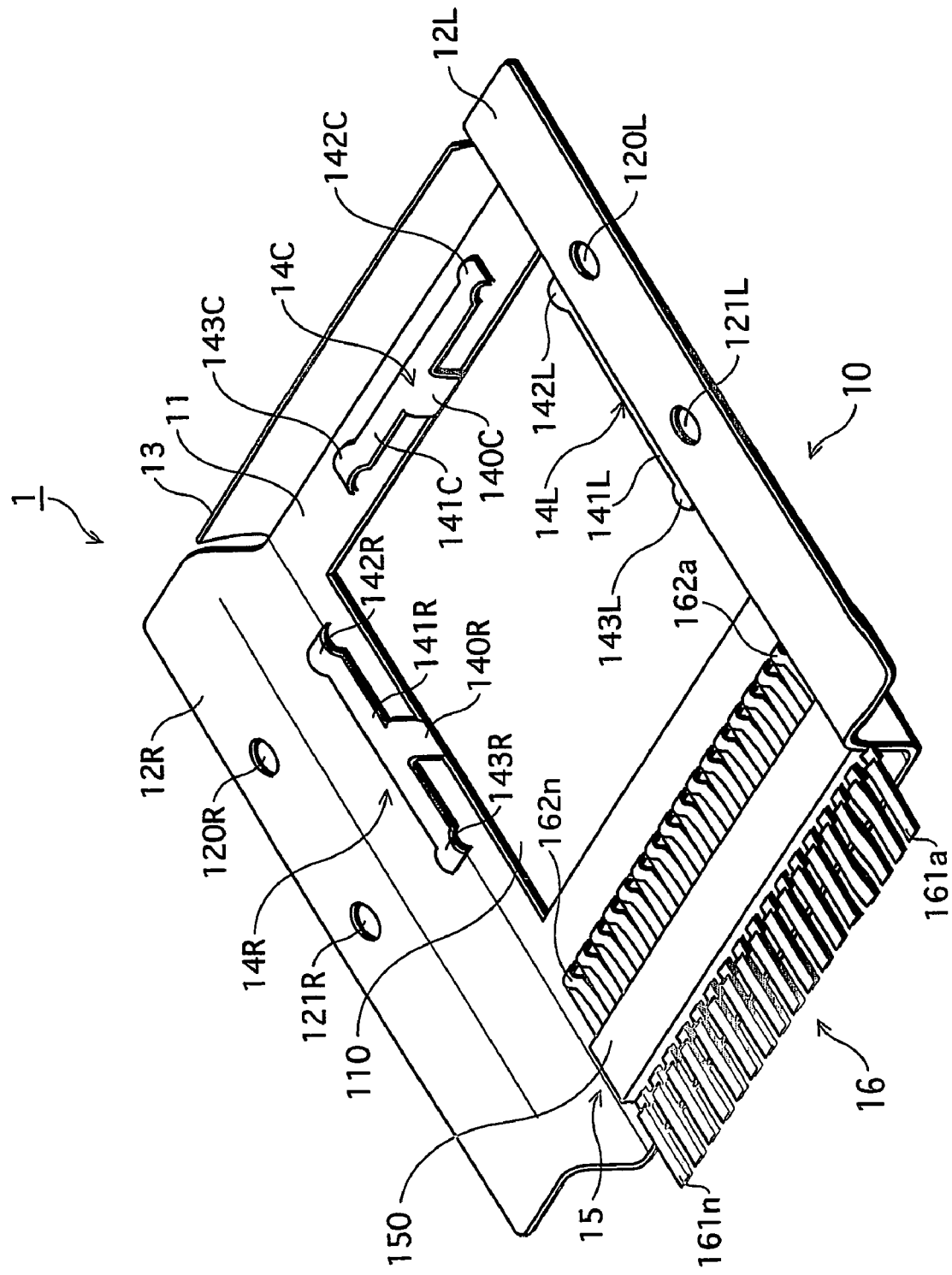
FIG. 2 shows a back side of the socket relating to the first embodiment.

FIG. 1 shows the construction of a socket 1 designed for an LED light source, relating to a first embodiment of the present invention. FIG. 2 shows the construction of a back side of the socket 1. FIGS. 15A to 15C show the construction of an LED card.

FIG. 1 shows the constructions of the socket 1 designed for an LED light source, a card-type LED module 1000 as one example of the LED light source (hereafter simply "LED card 1000"), and a heat sink 3000.

As shown in the figure, the heat sink 3000 is made from a rectangular solid metal member (here, aluminum member) with good heat-releasing properties. In one main surface of the heat sink 3000, a large number of fins 3002 are formed like the teeth of a comb, to enhance the heat-releasing effect. On another main surface 3001 of the heat sink 3000 (the upper surface in the figure), screw holes 3010 to 3013 (3013 not shown) for screws 3100 to 3103 used to fix the socket 1 are formed. The LED card 1000 is placed on the main surface 3001 of the heat sink 3000 so as to be positioned in its middle area surrounded by the screw holes 3010 to 3013.

The LED card 1000 includes a metal base substrate 1003 with good heat-releasing properties (for example, with dimensions of 28.5 mm (length)*23.5 mm (width)*1.2 mm (thickness)). The metal base substrate 1003 is formed by laminating a mount layer 1032 and a metal layer 1031. The mount layer 1032 has a light source unit 1002 and LED feeding terminals 1001a to 1001n mounted thereon, and has a thickness of 0.2 mm. The metal layer 1031 is made of aluminum or the like, and has a thickness of 1.0 mm. the metal layer 1031 is provided for the purpose of enhancing the heat-releasing effect.

The following describes a detailed construction of the LED card 1000. As a cross sectional view of the LED card 1000 is shown in FIG. 15B, the light source unit 1002 includes an 8 by 8 matrix of 64 LED elements 1010 and an aluminum reflector plate 1020. Each LED bare chip 1013 is contained in a semi spherical resin lens with a diameter of 2 mm. The lens containing each LED bare chip 1013 is partially embedded in the aluminum reflector plate 1020 in such a manner that a gradient surface is formed to surround the LED element 1010. As shown in FIGS. 15C and 15D, a phosphor and resin 1012 is coated on each LED bare chip 1013, and a silicone resin or an epoxy resin is filled on the phosphor+resin coating to form a resin lens 1011 (a detailed construction of the LED card 1000 is described in Japanese Laid-Open Patent Application No. 2003-124528). It should be noted here that the mount layer 1032 is wider than the light source unit 1002, and that margins are left around the light source unit 1002. The LED elements 1010 are arranged appropriately in such a manner that some are in series and others are in parallel, and are electrically connected to the feeding terminals 1001a to 1001n. The feeding terminals 1001a to 1001n are respectively connected to elastic contact units 162a to 162n of an external terminal 16 of the socket 1.

As shown in FIGS. 1 and 2, the socket 1 is composed of a frame member 10, the socket external terminal 16, and the like. The frame member 10 is a main body of the socket 1, and is made of a stainless steel plate with a thickness of 0.1 to 0.5 mm, which has good heat-releasing properties. The stainless steel plate is specifically subjected to such processing as pressing, bending, and cutting, to be shaped into the frame member. The frame member 10 has a main surface 11 in which an opening unit 110 is formed to fit for the size of the light source unit 1002 of the LED card 1000, fixing legs 12R and 12L, and a leg 13. The fixing legs 12R and 12L and the leg 13 are formed by cutting the corresponding parts of the stainless steel plate and bending the cut parts at the edges of the main surface 11 at substantially right angles, to form a cross-sectional U-shape across the width with fixing legs 12R and 12L extending outward. The fixing legs 12R and 12L have their edge parts further bent to be in parallel with the main surface 11. Screw holes 120R, 121R, 120L, and 121L are formed in the edge parts of the fixing legs 12R and 12L. It should be noted here that parts of the stainless steel plate corresponding to the edge vicinities of the opening unit 110 are also subjected to such processing as bending and cutting, which is described later. A material for the frame member 10 may be brass with good heat-releasing properties instead of stainless steel.

As shown in FIG. 2, three elastic pressing units 14R, 14L, and 14C are formed at inner edges of the rectangular opening unit 110 of the socket 1. The elastic pressing units 14R, 14L, and 14C are blade spring structures formed integrally as parts of the frame member 10. At the inner edges of the opening unit 110, the elastic pressing units 14R, 14L, and 14C are formed by punching the corresponding parts of the stainless steel plate into T-shaped parts and bending the T-shaped parts. The resulting elastic pressing units 14R, 14L, and 14C specifically have such a construction where bars 140R, 140L, and 140C support bars 141R, 141L, and 141C (141L not shown) whose both ends are processed to form arch shaped pressing contact units 142R, 143R, 142L, 143L, 142C, and 143C. As described in detail later, the socket 1 is formed in such a manner that its height in the thickness direction is a little smaller than the total of the height of the elastic pressing units 14R, 14L, and 14C and the height of the LED card 1000 in the thickness direction, to securely press the LED card 1000 against the main surface 3001 of the heat sink 3000 by the elastic pressing units 14R, 14L, and 14C.

On the back surface of the socket 1, a feeding terminal unit 15 is provided along one side of the opening unit 110, at such positions corresponding to the feeding terminals 1001a to 1001n of the LED card 1000. The feeding terminal unit 15 has a construction where a terminal holding member 150 (an insulating housing) made of a resin material, such as liquid crystal polymer and a heat resistant and flame retardant material, supports the external terminal 16. The external terminal 16 is made of phosphor bronze having high electric conductivity and high durability against insertion and removal operations. The feeding terminal unit 15 has elastic contact units 162a to 162n projected in the direction where the opening unit 110 is positioned. The elastic contact units 162a to 162n are warped in the thickness direction of the socket 1. Together with the elastic pressing units 14R, 14L, and 14C, the elastic contact units 162a to 162n produce the effect of pressing the LED card 1000 against the heat sink 3000. The elastic contact units 162a to 162n are electrically connected to the external terminal 16 of the LED card 1000. External contact units 161a to 161n of the feeding terminal unit 15 are projected externally from the socket 1, and receive power supply from an external power source. To be more specific, the external contact units 161a to 161n are connected to a well-known LED lighting circuit via a connector (not shown), are supplied with power, and are driven accordingly.

The LED card 1000 can be removed and replaced easily by removing the screws 3100 to 3103 as shown in FIG. 1. Here, the fixing of the socket 1 and the heat sink 3000 may not necessarily be realized by using the screws 3100 to 3103, but may be realized by other methods (e.g., using pairs of hooks and tabs). Also, the heat sink 3000 may not necessarily be rectangular, but may be in other shapes as long as the heat sink 3000 has a flat surface with less warping and projections and recessions, to at least allow the back surface of the LED card 1000 to entirely come in contact with the surface of the heat sink 3000.

1-2. Effect of the LED Light-Source Socket

According to the above-described construction of the socket 1, the LED card 1000 can be placed within the socket 1 with its light source unit 1002 being exposed through the opening unit 110, and with being fixed by the fixing legs 12R and 12L and the leg 13 of the socket 1, and being fixed, together with the socket 1, to the heat sink 3000 via the screws 3100 to 3103 screwed into the screw holes 120R, 121R, 120L, and 121L.

Here, the LED card 1000 comes in contact with the pressing contact units 142R, 143R, 142L, 143L, 142C, and 143C, and the elastic contact units 162a to 162n. Due to the elastic force of the three elastic pressing units 14R, 14L, and 14C and the elastic contact units 162a to 162n of the external terminal 16, the LED card 1000 is securely pressed against the main surface 3001 of the heat sink 3000. Here, the LED card 1000 is fixed, with receiving pressures applied by the three elastic pressing units 14R, 14L, and 14C, and the elastic contact units 162a to 162n in a range of 0.3 to 6.7 kg to the LED card 1000 overall, i.e., in a range of about 0.05 to 1.00 kg/cm² inclusive. This range of pressures is determined by considering the optimum pressing effect and the mechanical strength of the substrate used for the LED card 1000. Due to this, the back surface of the LED card 1000 where the metal layer 1031 is formed favorably comes into contact with the heat sink 3000.

Figure 3:
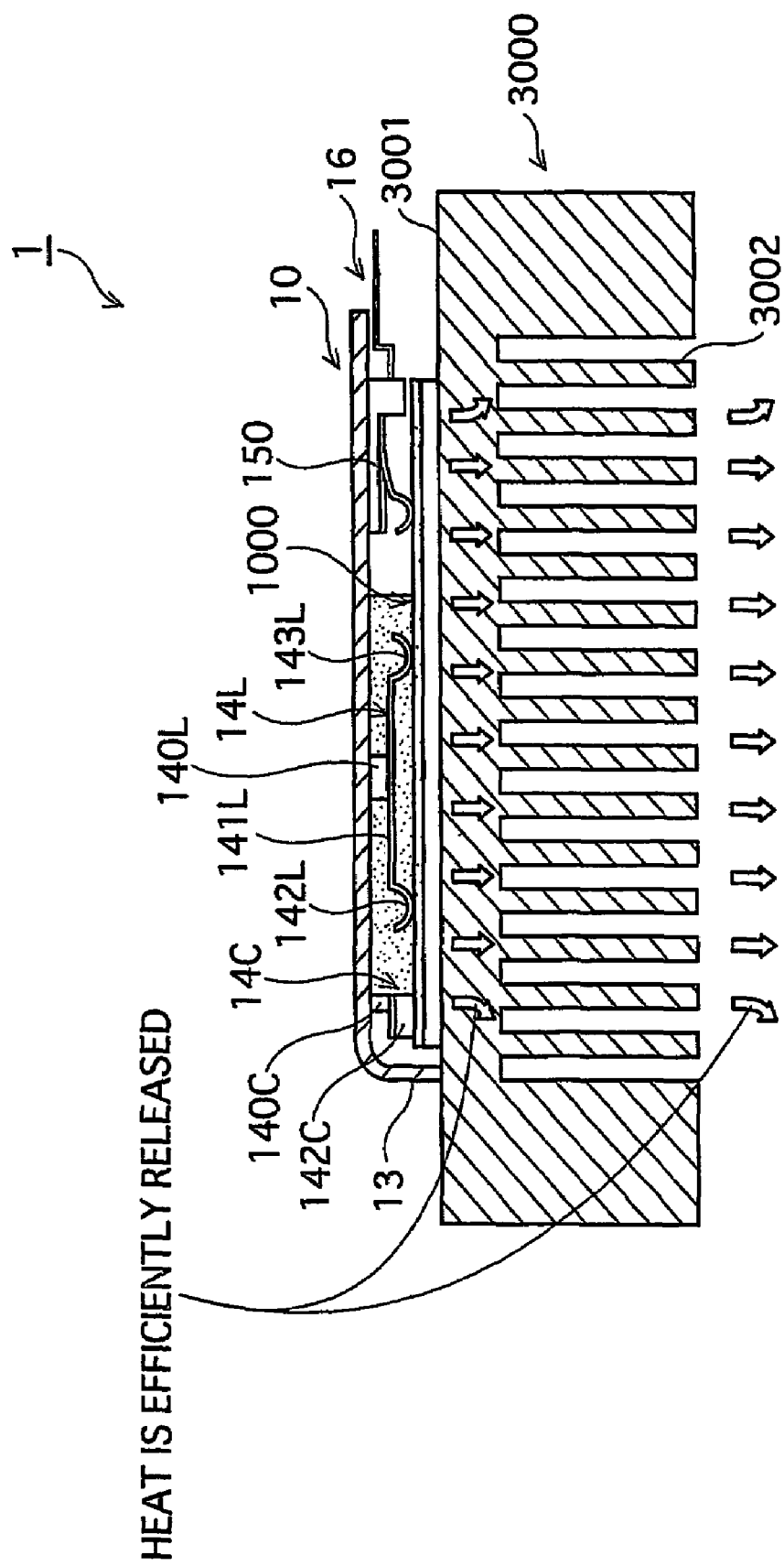
FIG. 3 shows a cross sectional view of the socket, for explaining the effect of the present invention.

As a cross sectional view of the LED card is shown in FIG. 3, the contact between the LED card 1000 and the heat sink 3000 enables generated heat to be conducted through the entire back surface of the LED card 1000 to the heat sink 3000. For lighting applications, the LED card 1000 is required to produce a high illuminance as compared with a case where the LED card 1000 is simply lit for use in displays etc. For example, each LED element 1010 is supplied with a relatively large current of about 40 mA, and therefore, heat generated along with the supply current often causes problems. The first embodiment of the present invention however can produce an extremely high heat-releasing effect, and therefore enables stable driving and lighting of the LEDs. The luminous efficiency of LEDs tends to be lowered as the temperature increases. Therefore, the heat releasing effect produced by the first embodiment enables a plurality of densely packaged LED elements to exhibit favorable luminous efficiency. This is extremely advantageous when LEDs with poor high-temperature characteristics are used for lighting applications.

An LED light-source socket is typically required to have a relatively large opening unit 110, to enable the light source unit 1002 of the LED card 1000 to be exposed through the opening unit. It is therefore basically difficult to provide the LED light-source socket with such means of pressing the LED card 1000 to the heat sink 3000. The first embodiment of the present invention however solves this problem by forming the elastic pressing units 14R, 14L, and 14C in the edge vicinities of the opening unit 110 by such processing as bending and cutting.

Further, according to the first embodiment, as well as second and third embodiments of the present invention described later, the sockets 1 to 3 are each fixed to the heat sink 3000 via screws. By adjusting an amount by which the screws are screwed into the holes, a degree of contact between the LED card 1000 and the heat sink 3000 can be adjusted.

2. Second Embodiment

Figure 4:
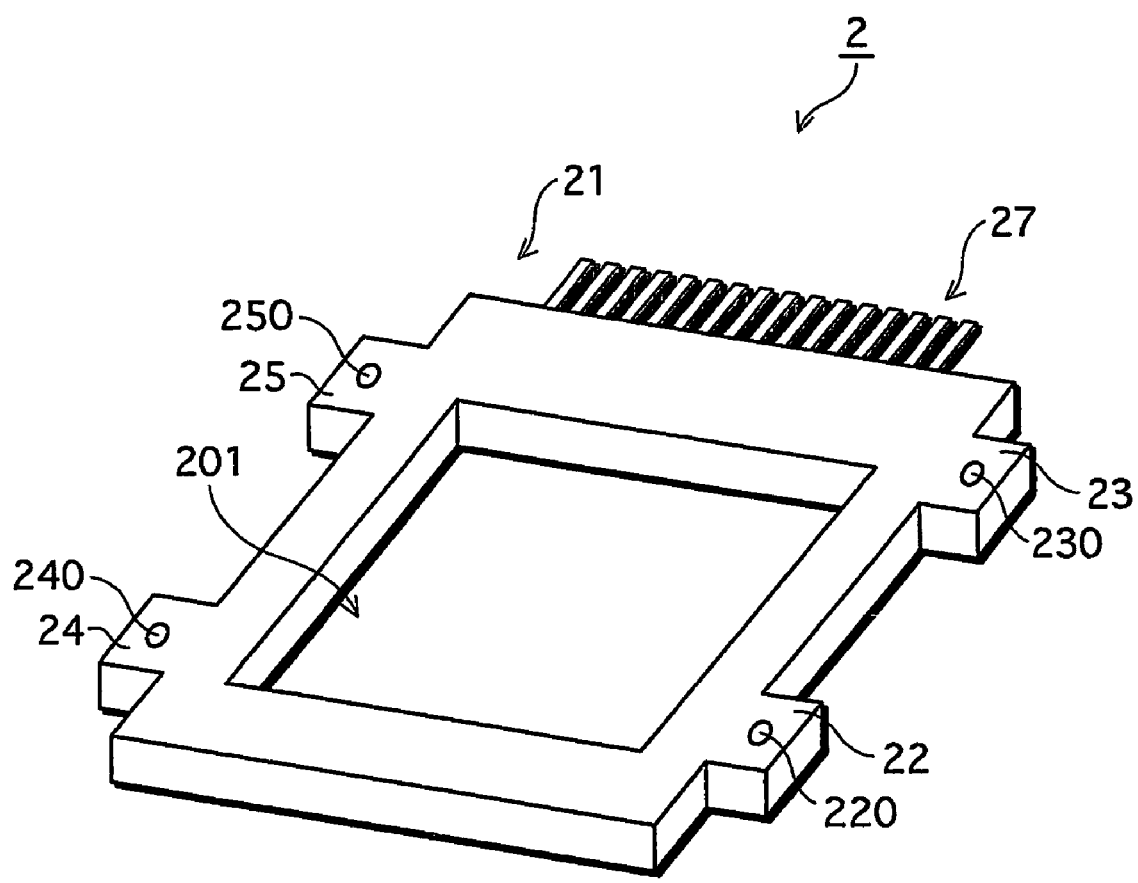
FIG. 4 shows the construction of an LED light-source socket relating to a second embodiment of the present invention.

FIG. 4 shows the construction of an LED light-source socket relating to a second embodiment of the present invention.

The socket 2 relating to the second embodiment shown in the figure is, as its characteristic, formed by processing an aluminum plate with high heat conductivity. The socket 2 has a construction where an external terminal unit 27 having the same construction as that in the first embodiment is attached to a frame member 21 in which an opening unit 201 is formed by punching or shaving off the corresponding part of the aluminum plate. The lower surface of the frame member 21 is subjected to such patterning to form steps that correspond to the shape of the LED card 1000, so that the LED card 1000 can be securely covered and held by the frame member 21. The second embodiment differs from the first embodiment in that the frame member 21 of the socket 2 presses the peripheral parts of the light source unit 1002. It should be noted here that a heat sink with the same construction as the heat sink 3000 can be used in the present embodiment.

According to the above-described construction of the socket 2, the LED card 1000 can be placed right below the frame member 21. Using screw holes 220 to 250 formed in projected parts 22 to 25 of the frame member 21 shown in the figure, the LED card 1000 can be fixed to the heat sink. Here, the light source unit 1002 of the LED card 1000 is exposed through the opening unit 201, with its peripheral parts being pressed in the direction of the main surface 3001 of the heat sink 3000 by the frame member 21. Therefore, the back surface of the LED card 1000 and the main surface 3001 of the heat sink 3000 favorably come in contact. As a result of this, the socket 2 can produce a high heat-releasing effect as the effect described in the first embodiment.

3. Third Embodiment

Figure 5:
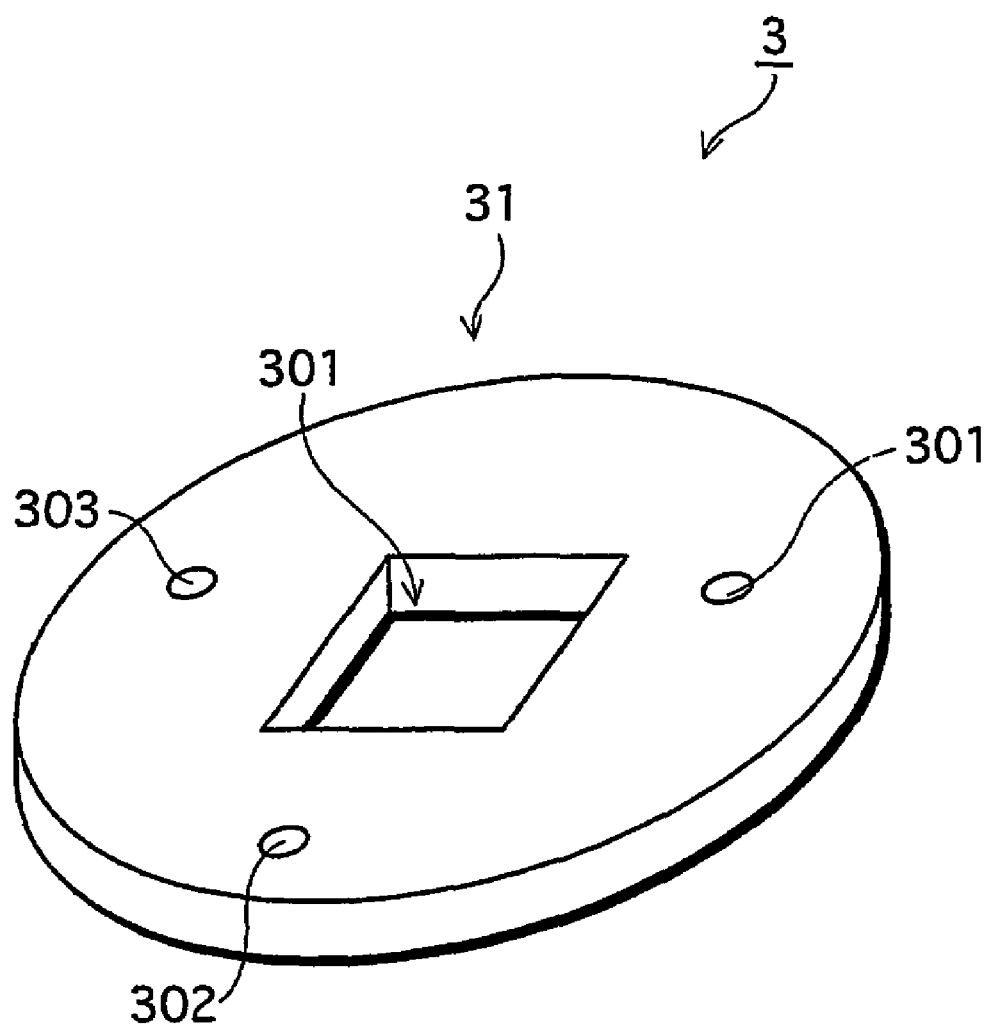
FIG. 5 shows the construction of an LED light-source socket relating to a third embodiment of the present invention.

FIG. 5 shows the construction of an LED light-source socket relating to a third embodiment of the present invention.

As shown in the figure, the shape of the socket of the present invention should not be limited to the rectangular shape employed in the first and second embodiments. The socket 3 relating to the third embodiment is composed of a circular frame member 31 in which an opening unit 301 is formed. Screw holes 301 to 303 are formed in the frame member 31.

The socket 3 having this construction relating to the third embodiment can produce substantially the same effect as the effect described in the second embodiment. To be specific, the LED card 1000 can be positioned right below the frame member 31. Using the screw holes 301 to 303 shown in the figure, the socket 3 in which the LED card 1000 is set can be fixed to the heat sink. Here, the light source unit 1002 of the LED card 1000 is exposed through the opening unit 201, with its peripheral parts being pressed in the direction of the main surface 3001 of the heat sink 3000 by the frame member 31. Therefore, the back surface of the LED card 1000 and the main surface 3001 of the heat sink 3000 favorably come in contact. As a result of this, the socket 3 can produce a high heat-releasing effect while securely holding the LED card 1000.

4. Fourth Embodiment

4-1. Construction of the Socket 4

Figure 6:
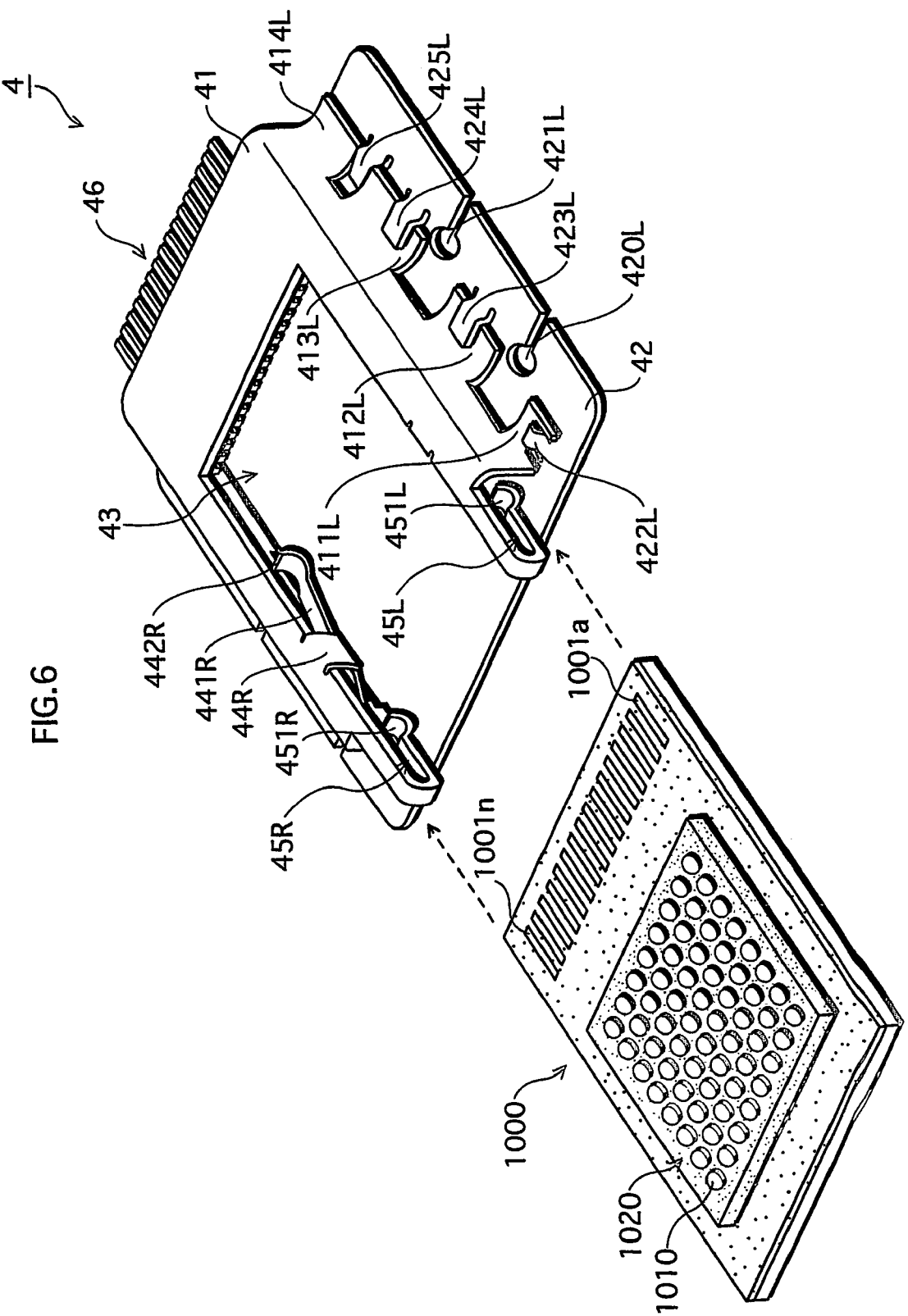
FIG. 6 shows the construction of an LED light-source socket relating to a fourth embodiment of the present invention.

FIG. 6 shows the construction of an LED light-source socket relating to a fourth embodiment of the present invention.

The socket 4 shown in the figure has, in addition to the effect described in the first to third embodiments, an advantage of enabling extremely easy mounting and removing of the LED card 1000.

The socket 4 has a construction composed of an upper member 41 and a lower member 42 each of which is formed by subjecting a stainless steel plate to such processing as punching and bending. The upper member 41 and the lower member 42 are combined to form a space between them.

The upper member 41 is a rectangular frame member in which a rectangular opening unit 43 is formed. The rectangular frame member however has, on its entire one side, a cutout area that spatially connects the opening unit 43 and the outside of the socket 4 (in other words, one side of the rectangular frame member is missing). The cutout area has the function of guiding the light source unit 1002 of the LED card 1000, and also serves as a slot area through which the LED card 1000 is inserted into the space between the upper member 41 and the lower member 42.

A plurality of hooks 411L, 412L, 413L, 414L, 411R, 412R, 413R, and 414R (411R, ... not shown) are formed in edge parts of the upper member 41.

The lower member 42 is a plate member, and has, at its edge parts on its main surface, hooks 422L, 423L, 424L, 425L, 422R, 423R, 424R, and 425R (422R, ... not shown) formed by cutting and bending the corresponding parts of the plate member.

As shown in FIG. 6, the upper member 41 and the lower member 42 are fixed together by combining these hooks 411L etc., and 422L etc. A certain space is provided between the upper member 41 and the lower member 42. In the fourth embodiment, the LED card 1000 is inserted in this space formed between the upper member 41 and the lower member 42.

On the back surface of the upper member 41, elastic contact units 451R and 451L and elastic contact units 442R and 442L (442L not shown) supported by elastic contact units 45R and 45L and bars 44R and 44L (44L not shown) are formed at two sides of the opening unit 43 of the upper member 41, and terminals of an external terminal unit 46 are formed at one side of the opening unit 43 of the upper member 41.

The elastic contact units 45R etc. produce the effect of pressing the LED card 1000 placed between the upper member 41 and the lower member 42, to enable the back surface of the LED card 1000 to come in contact with the main surface of the lower member 42.

Further, screw holes 420L, 421L, 420R, and 421R (420R and 421R not shown) are formed in the lower member 42. The lower member 42 can be fixed in contact with the main surface 3001 of the heat sink 3000 by the screws 3100 to 3103.

4.2 Effect of the Socket 4

According to the above-construction of the socket 4, the LED card 1000 can be inserted through the cutout area of the upper member 41 around which the elastic contact units 45R and 45L are provided, into the space between the upper member 41 and the lower member 42. When the LED card 1000 is inserted, the back surface of the LED card 1000 can be pressed against the surface of the lower member 42 by the elastic contact units 45R etc. In this way, the LED card 1000 can be securely held within the socket 4 without being dropped from the socket 4.

Here, by fixing the lower member 42 in contact with the heat sink 3000 or the like, heat generated in the LED card 1000 can be efficiently released from the heat sink via the lower member 42. In this way, the socket 4 can produce the same high heat-releasing effect as the effect described in the first to third embodiments.

In addition to this effect, the socket 4 relating to the fourth embodiment has an advantage due to its characteristic that the upper member 41 has, on its entire one side, a cutout area spatially connecting the opening unit 43 and the outside of the socket 4 unlike in the first to third embodiments. Due to this characteristic, the socket 4 has the advantage of enabling easy mounting and removing, and replacement of the LED card 1000 even after the socket 4 is fixed to the heat sink 3000 by the screws 3100 to 3103.

To enable favorably easy mounting and removing of the LED 1000 in the fourth embodiment, pressures applied by the elastic contact units 44R, 45R, 44L, and 45L need to be controlled so as not to be too high.

5. Fifth Embodiment

Figure 7:
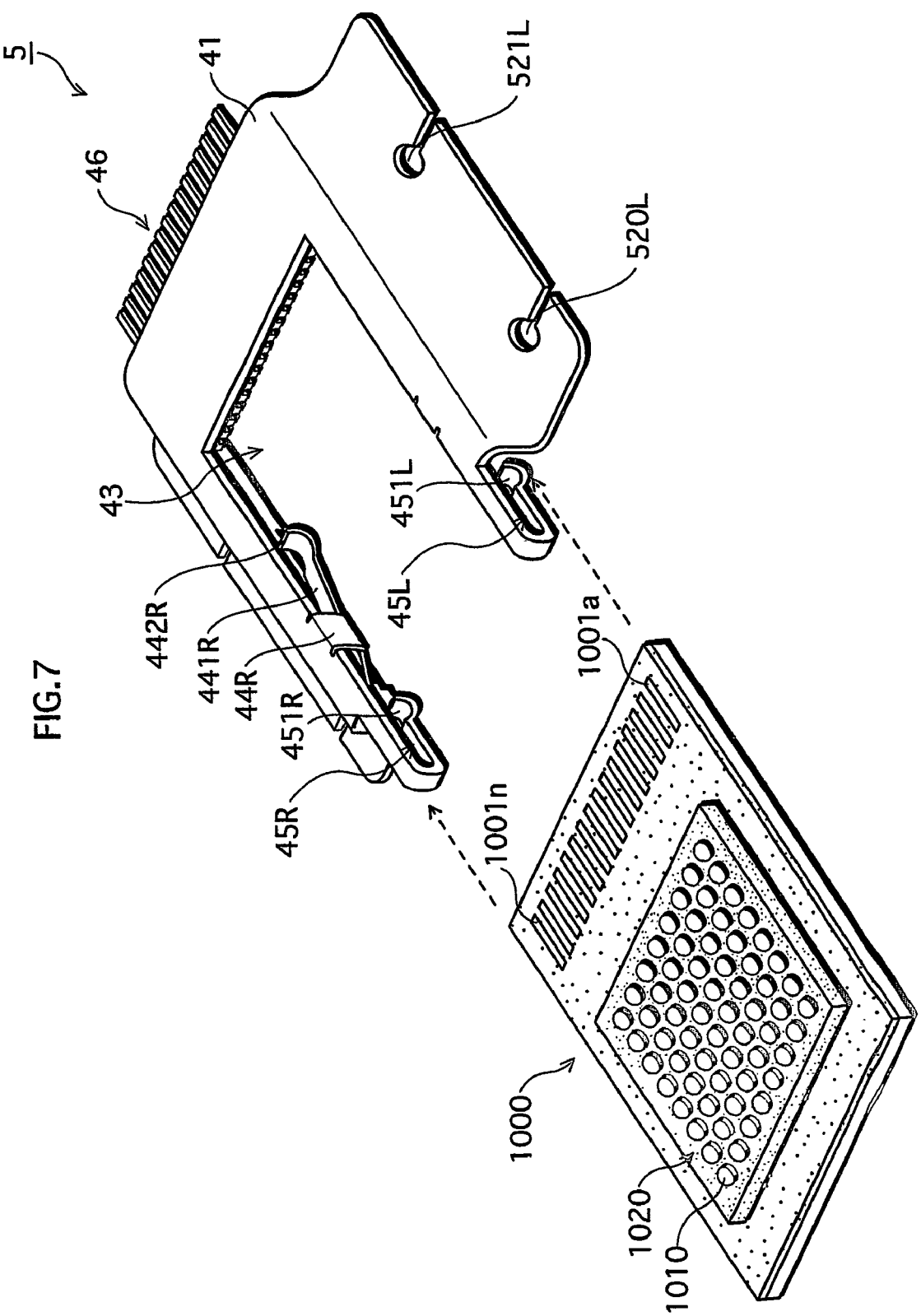
FIG. 7 shows the construction of an LED light-source socket relating to a fifth embodiment of the present invention.

FIG. 7 shows the construction of an LED light-source socket relating to a fifth embodiment of the present invention.

Although the fourth embodiment describes, as one example, a construction where the lower member 42 and the upper member 41 are combined, the LED light-source socket of the present invention should not be limited to this construction. For example, as shown in FIG. 7, the socket 5 relating to the fifth embodiment does not have a lower member, but is characterized by its relatively simple construction composed of an upper member 41 alone. Screw holes 520R, 521R, 520L, 521L, etc., are formed in edge parts of the upper member 41. The construction of the socket 5 is substantially the same as that of the socket 4 relating to the fourth embodiment except that the screw holes 520R, 521R, 520L, and 521L are formed in the edge parts of the upper member 41.

The socket 5 having this construction is fixed to the heat sink 3000 or the like using the screw holes 520R, 521R, 520L, and 521L. The LED card 1000 is inserted through a cutout area of the upper member 41 spatially connecting the opening unit 43 and the outside, into a space formed between the upper member 41 and the heat sink. Here, the LED card 1000 is pressed, in direct contact, against the heat sink (not shown) by the elastic contact units 45R etc. In this way, the LED card 1000 is securely held by the socket 5 without being dropped from the socket 5. At the same time, heat generated in the LED card 1000 can be directly released to the heat sink. The socket 5 relating to the fifth embodiment therefore can produce a higher heat-releasing effect than the socket 4 relating to the fourth embodiment.

6. Sixth Embodiment 6.1 Overall Construction of the Lighting System

Figure 8:
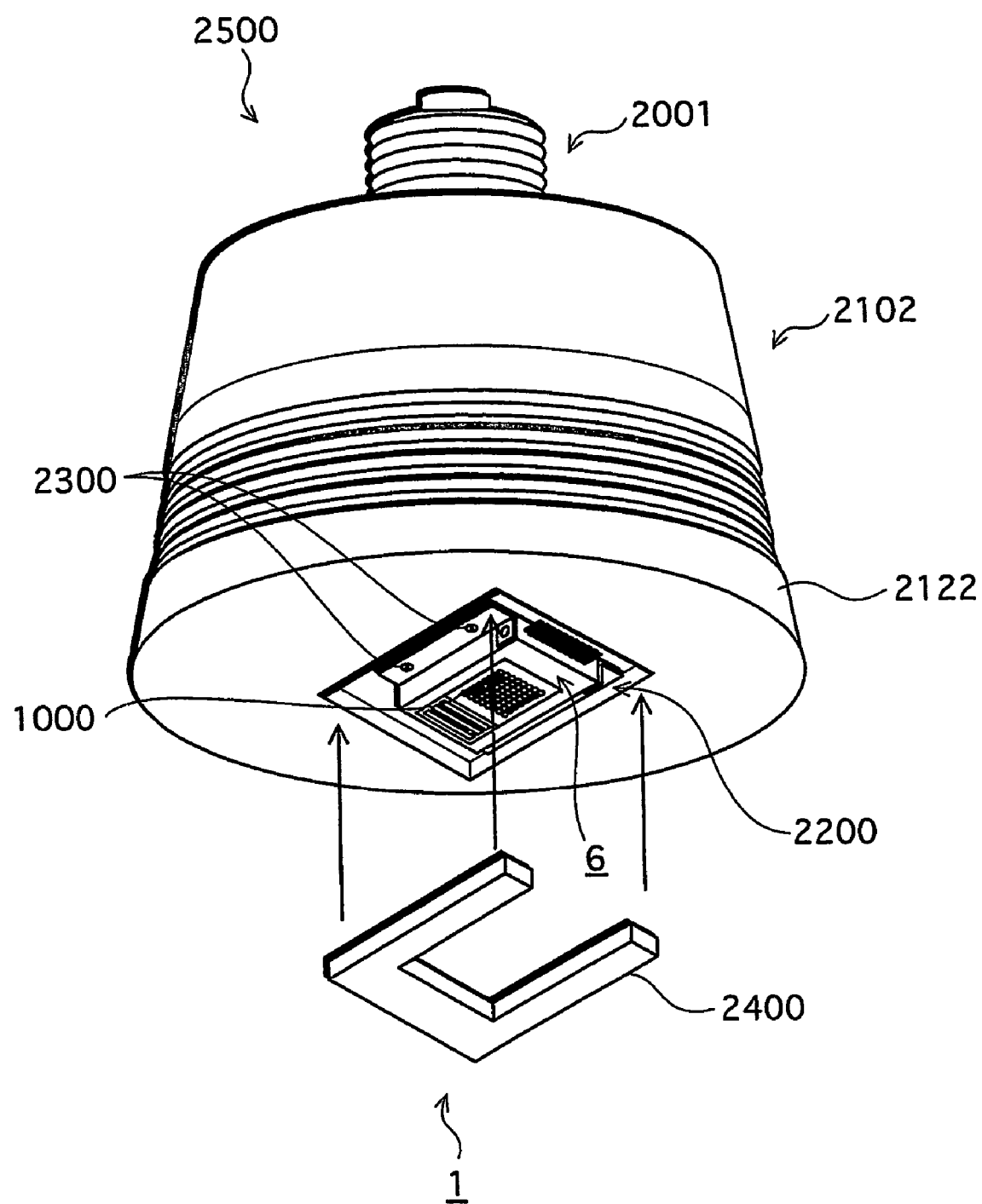
FIG. 8 shows a perspective view of the construction of a lighting system relating to a sixth embodiment of the present invention.
Figure 9:
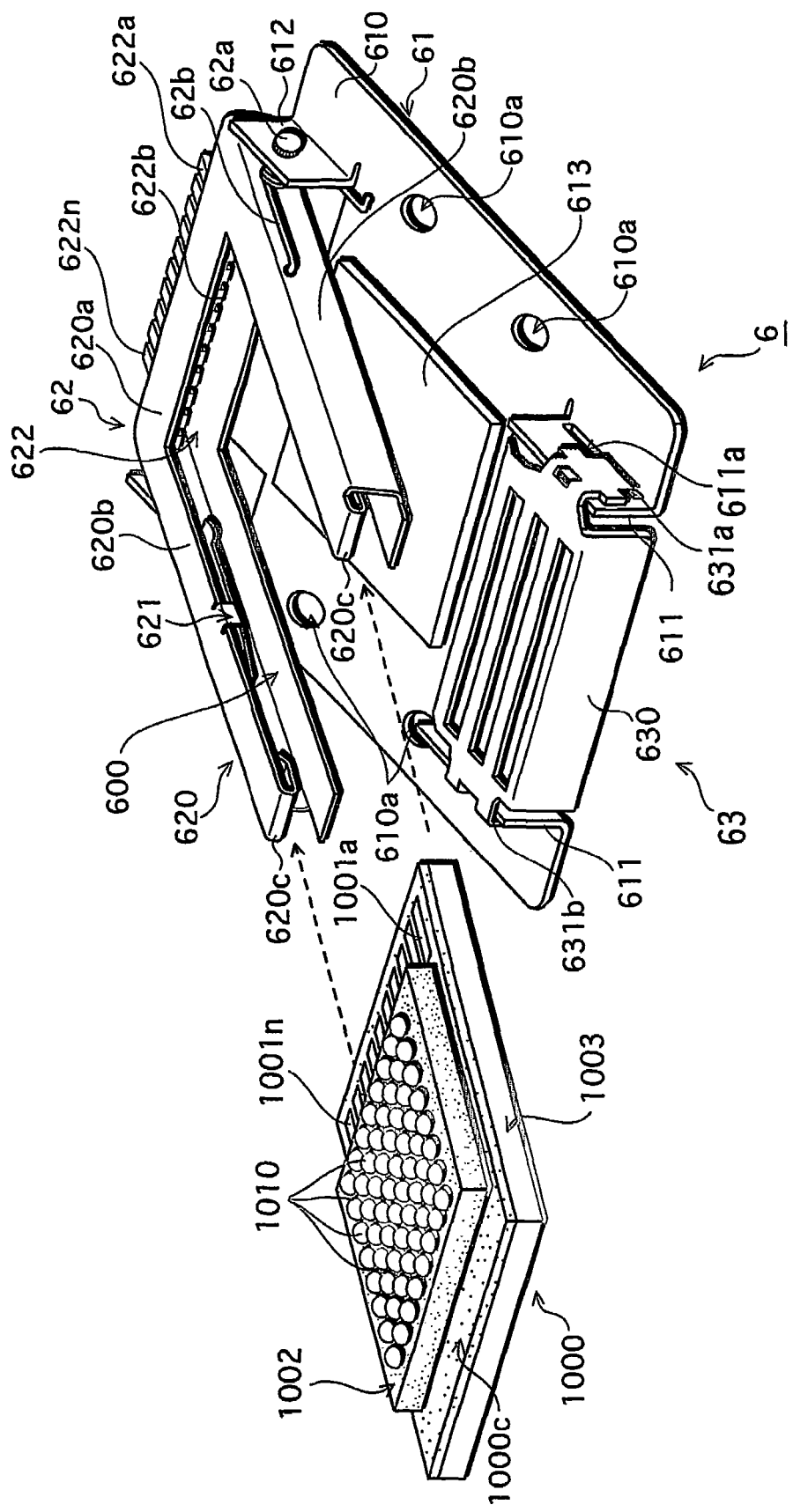
FIG. 9 shows the construction of an LED light-source socket relating to the sixth embodiment.
Figure 10:
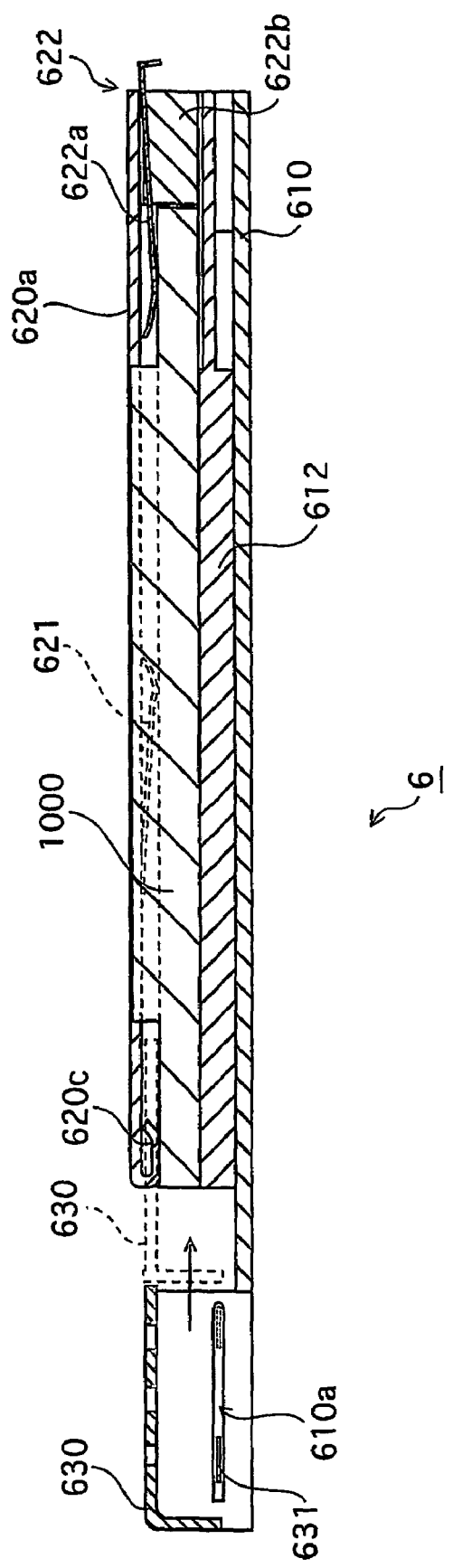
FIG. 10 shows a side cross sectional view of the construction of the socket relating to the sixth embodiment.

FIG. 8 shows a perspective view of the construction of a lighting system 2500 relating to a sixth embodiment of the present invention. The lighting system 2500 uses the LED card 1000 as its LED light source. FIG. 9 shows the construction of a socket 6 relating to the sixth embodiment for an LED light source. FIG. 10 shows a cross sectional view of the socket 6.

As shown in FIG. 8, the lighting system 2500 includes a base 2001, a case 2102, and the socket 6. The LED card 1000, which is a light source, can be set in the socket 6 in a replaceable manner.

The base 2001 employs the same specifications as those employed by typical incandescent lamps. The base 2001 supplies alternating current, which is supplied from an external commercial power source, to a power source circuit (not shown) of the case 2102.

The case 2102 has a tapering-off cylindrical shape, which is like a shape of a cone whose top part is cut off. The base 2001 is attached to the top surface of the case 2102, and a plate-shaped heat sink 2122 is provided on the bottom surface of the case 2102. Within the case 2102, a well-known power source circuit (not shown) is placed for converting alternating current supplied from the base 2001 to direct current and supplying the direct current to the socket 6.

As shown in FIG. 8, the heat sink 2122 has a rectangular recessed part 2200 at the center of its main surface. The socket 6 relating to the sixth embodiment is fixed within the recessed part 2200 via screws 2300. It is preferable to form the recessed part 2200 to have such a depth that does not allow the socket 6 to be projected from the surface of the heat sink 2122.

Figure 16:
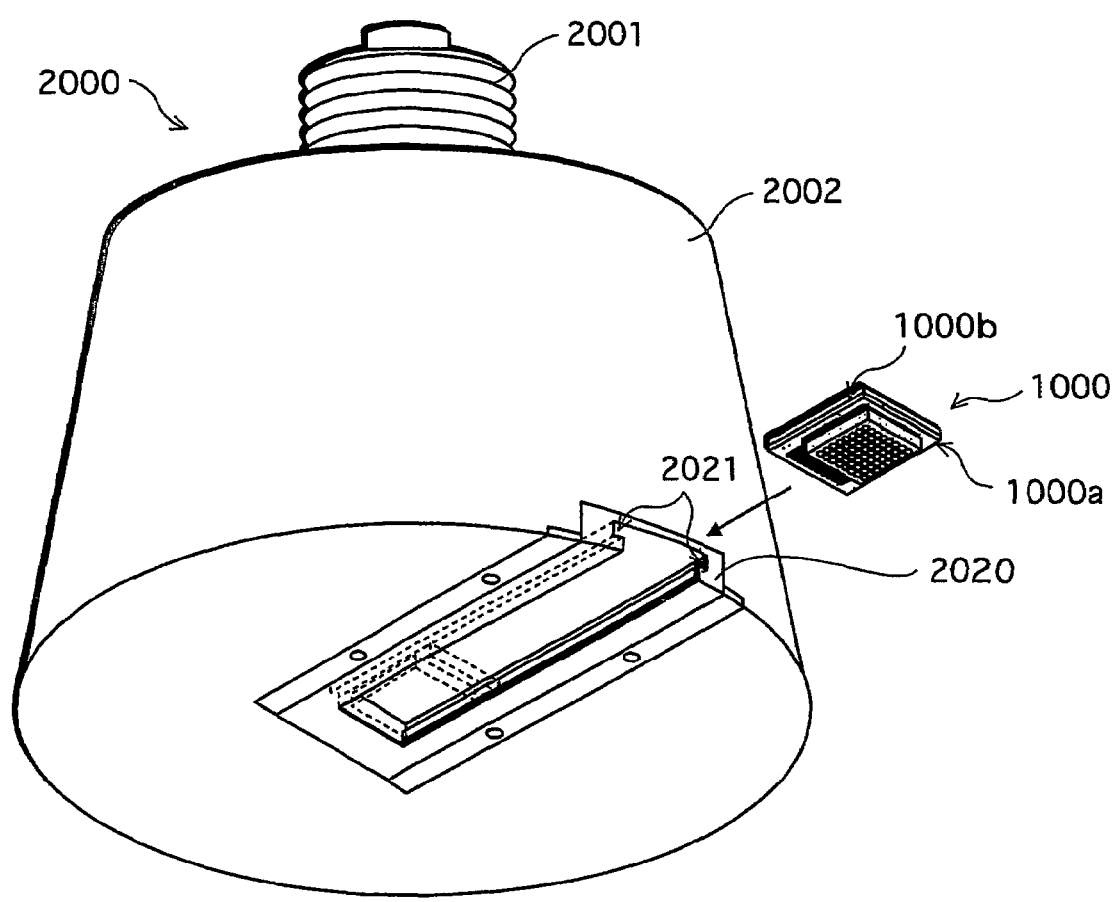
FIG. 16 shows a perspective view of a conventional lighting system.

By the swaying operation described later, the LED card 1000 is set, in a freely removable manner, in the socket 6 fixed within the recessed part 2200. A cover 2400, which has a rectangular frame shape whose one side is missing, is then placed within the recessed part 2200, to cover the LED card 1000 in a state where the light source unit of the LED card 1000 is exposed. Due to the presence of the recessed part 2200 and the cover 2400, a substantially flat surface is formed with respect to the main surface of the heat sink 2122, around the periphery of the socket 6. Therefore, the lighting system 2500 relating to the sixth embodiment can have a beautiful finish without any disfigurement, compared for example with the conventional lighting system 2000 shown in FIG. 16. The good appearance of the lighting system 2500 can be realized in this way, with the use of the socket 6 whose construction is described below.

6-2. Construction of the Socket 6

As shown in FIG. 9, the socket 6 relating to the sixth embodiment is formed by combining a lower member 61 and an upper member 62 via a hinge. With the construction described below, the socket 6 bases its operation on the swinging motion.

The lower member 61 includes a lower member main unit 610 that is a rectangular plate made for example from a nickel-plated brass substrate with high heat conductivity. In one of the two shorter sides of the lower member main unit 610, a pair of lock supporting parts 611 is formed at facing positions. In the other one of the two shorter sides of the lower member main unit 610, a pair of upper member supporting parts 612 is formed at facing positions. The lock supporting parts 611 and the upper member supporting parts 612 are formed by cutting and bending the corresponding parts of the lower member main unit 610.

The lock supporting parts 611 are rectangular parts formed by cutting the corresponding parts of the lower member main unit 610 and bending the cut parts so as to be perpendicular to the main surface of the lower member main unit 610. The two lock supporting parts 611 are positioned symmetric to each other with a certain distance between them. In the two lock supporting part 611 respectively, guide openings 611*a* and 611*b* (611*b* not shown) that extend parallel to the main surface of the lower member main unit 610 are formed. A slide plate 630 is set on the lock supporting parts 611, to form a lock unit 63.

As shown in FIG. 9, the slide plate 630 has such a shape where two shorter sides and one longer side of a rectangular plate are bent in the perpendicular direction. The slide plate 630 has projections 631*a* and 631*b* formed respectively in the two shorter sides. The tips of the projections 631*a* and 631*b* are placed in the guide openings 611*a* and 611*b*. Due to this, the slide plate 630 is supported by the lower member main unit 610 in a freely slidable manner. With the sliding motion of the slide plate 630, the lock unit 63 can partially cover an edge part 1000*c* of the LED card 1000 set between arm parts 620*b* of the upper member 62, thereby indirectly locking the upper member 62. Here, the slide plate 630, with its height being appropriately set, can securely hold the LED card 1000 while appropriately pressing the LED card 1000 against the lower member 61.

Like the lock supporting parts 611, the upper member supporting parts 612 are also rectangular parts formed by cutting the corresponding parts of the lower member main unit 610 and bending the cut parts so as to be perpendicular to the main surface of the lower member main unit 610. The two upper member supporting parts 612 are positioned symmetric to each other with a certain distance between them. The upper member supporting parts 612 have a hinge axis 62*a* placed to extend in the direction of a shorter side of the lower member 61. On the hinge axis 62*a*, the upper member 62 can freely swing open and close.

In the sixth to ninth embodiments, for the swing-type LED light-source socket of the present invention, the state where the upper member swings on the hinge axis away from the lower member is referred to as "an open state", and the state where the upper member is directly or indirectly locked on the lower member is referred to as "a closed state".

It should be noted here that a heat-releasing sheet 613 is placed in a predetermined area of the main surface of the lower member main unit 610 (at the central area in the example of FIG. 9). The heat-releasing sheet 613 is placed in such an area corresponding to the area where the LED card 1000 held by the upper member 62 is to be positioned. The heat-releasing sheet 613 comes in contact with the back surface of the LED card 1000, so that heat generated in the LED card 1000 can be released to the heat sink 2122 via the lower member 61.

Also, a plurality of screw holes 610*a* are formed in edge parts of the lower member main unit 610, to fix the lower member main unit 610 to the heat sink 2122 shown in FIG. 8 via screws.

The upper member 62 has a rectangular frame shape whose one side is missing, and is made from a member with a rectangular cross section whose one side to be positioned at the inside of the frame opening of the upper member 62 is missing. To be more specific, the upper member 62 includes a base part 620*a* and a pair of arm parts 620*b* extending respectively from both ends of the base part 620*a* in one direction. The upper member 62 has substantially the same size as the lower member 61 overall, and is formed to be in a rectangular shape whose one shorter side is cut off, with two longer sides of the rectangular shape corresponding to the arm parts 620*b* and the remaining shorter side of the rectangular shape corresponding to the base part 620*a*. An area surrounded by the two arm parts 620*b* and the base part 620*a* corresponds to an opening unit 600. The LED card 1000 is set between the arm parts 620*b* in a state where the light source unit 1002 is exposed through the opening unit 600.

Both ends of the base part 620*a* in its longitudinal direction are supported, on the hinge axis 62*a*, by the upper member supporting parts 612 of the lower member 61. In this way, the upper member 62 and the lower member 61 are combined together via the hinge. Inside the base part 620*a*, an external terminal unit 622 having the same construction as that described in the first to fifth embodiments is provided. To be more specific, the external terminal unit 622 includes a plurality of rectangular external terminals 622*a* to 622*n* and a terminal supporting member 622*b*. The external terminals 622*a* to 622*n* are to be electrically connected to feeding terminals 1001*a* to 1001*n* of the LED card 1000. The terminal supporting member 622*b* is made of insulating resin, and fixes the external terminals 622*a* to 622*n*, which are arranged in parallel, to the base part 620*a*.

As shown in FIG. 9, the arm parts 620*b* are formed to have a rectangular cross section whose one side is missing, and are placed so as to be symmetric to each other. The arm parts 620*b* having such cross sections serve as guide grooves for the LED card 1000, and also form a slot area through which the LED card 1000 is inserted. The LED card 1000 is guided through the guide grooves and set between the arm parts 620*b*. Within each arm part 620*b*, an elastic contact unit 621 is formed. The elastic contact units 621 are formed integrally as parts of the upper member 62. As shown in FIG. 9, the elastic contact units 621 are formed by cutting the corresponding parts of the plate used for the arm parts 620*b* into T shapes, and bending the T-shaped parts to form blade springs.

Further, at the tip of each arm part 620*b*, an elastic contact unit 620*c* is formed by folding a tip part of the arm part 620*b* inward. The elastic contact units 620*c* press edge parts of the LED card 1000 set between the arm parts 620*b*, to prevent the LED card 1000 from being dropped from the socket 6.

Between the lower member 61 and the upper member 62, springs 62*b* are placed around the hinge axis 62*a*. As shown in FIG. 9, both ends of each spring 62*b* respectively hold both the lower member 61 and the upper member 62. Due to this, pressures are normally (i.e., when the lock unit 63 is at an unlocked position) applied to the upper member 62 toward an open state. As shown in FIG. 9, a coil spring is suitable for use as the spring 62*b*.

6-3. Effect of the Socket 6

According to the above-construction of the socket 6, the following effect can be produced.

The following describes the effect produced by the socket relating to the sixth embodiment, based on the method for mounting the LED card 1000 onto the socket 6.

As shown in FIG. 9, for the socket 6 where the upper member 62 is in a normal open state, i.e., where the arm parts 620*b* of the upper member 62 are lifted up, the user inserts the LED card 1000 between the arm parts 620*b* until the LED card 1000 reaches the base part 620*a*. Due to this user operation, the feeding terminals 1001*a* to 1001*n* of the LED card 1000 are electrically connected to the external terminals 622*a* to 622*n* placed within the upper member 62.

After setting the LED card 1000 in this way, the user then sways down the arm parts 620*b* of the upper member 62 on the hinge axis 62*a*, to press the upper member 62 against the lower member 61.

FIG. 10 shows a cross sectional view of the socket 6 in a state where the upper member 62 is pressed against the lower member 61. With the socket 6 being in this state, the user moves the slide plate 630 in the arrow direction as indicated by a broken line in FIG. 10, to lock the edge part 1000*c* of the LED card 1000. This completes the operation for mounting the LED card 1000.

In this way, the LED card 1000 can be mounted on the socket 6 by simply placing the upper member into an open state and inserting the LED card 1000 between the two arm parts 620*b* in the sixth embodiment. Accordingly, the mounting and replacing operations of the LED card 1000 can be remarkably simplified and the burden on the user can be drastically alleviated, as compared with conventional cases.

Further, because the socket 6 bases its operation on the swinging motion as described above, the socket 6 can be embedded within the recessed part of the case 2102 as shown in FIG. 8. By doing so, the lighting system 2500 can have a beautiful finish without any disfigurement.

The LED card 1000 mounted in this way has its side parts 1000*a* and 1000*b* pressed against the lower member 61 by the elastic contact units 621 and 620*c* formed as blade springs. Therefore, the back surface of the LED card 1000 is pressed, in direct contact, against the heat-releasing sheet 613 placed on the lower member 61. Due to this, for the socket 6 relating to the sixth embodiment, heat generated in the LED card 1000 can be favorably conducted to the heat sink 2122 placed on the lower member 61 via the heat-releasing sheet 613 and the lower member 61, thereby producing a high heat-releasing effect.

Here, it is preferable to set the pressure applied by the elastic contact units 621, 620*c*, and the external terminals 622*a* to 622*n* to the LED card 1000 in such a range that does not damage the LED card 1000 and allows the LED card 1000 to be mounted and removed favorably by human hands. To be specific, it is preferable to set the pressure in a range of 0.05 to 1.00 kg/cm$^2$ inclusive.

It is preferable to set the height of the slide plate 630 to be substantially the same as the total of the height of the LED card 1000 in its thickness direction and the height of the heat-releasing sheet 613 in its thickness direction, or a little smaller than the total. By setting the height of the slide plate 630 in this way, the state where the slide plate 630 presses the LED card 1000 against the lower member 61 can be maintained. Due to this, the back surface of the LED card 1000 can be pressed, in direct contact, against the heat-releasing sheet 613 without via air whose heat conductivity is extremely low. Therefore, the heat-releasing effect can be improved further.

It should be noted here that the LED card 1000 can be removed by the procedure opposite to the above mounting procedure.

According to the sixth embodiment as described above, the upper member 62 holding the LED card 1000 can be fixed with being pressed against the lower member 61 by the lock unit 63. Therefore, the effect can be produced of efficiently releasing heat generated in the LED card 1000.

Further, the elastic contact units 621 and 620*c* are formed integrally as parts of the upper member 62, to reduce the number of components. In this way, another effect of reducing the manufacturing cost can be produced.

7. Seventh Embodiment 7-1. Construction of the Socket 7

Figure 11:
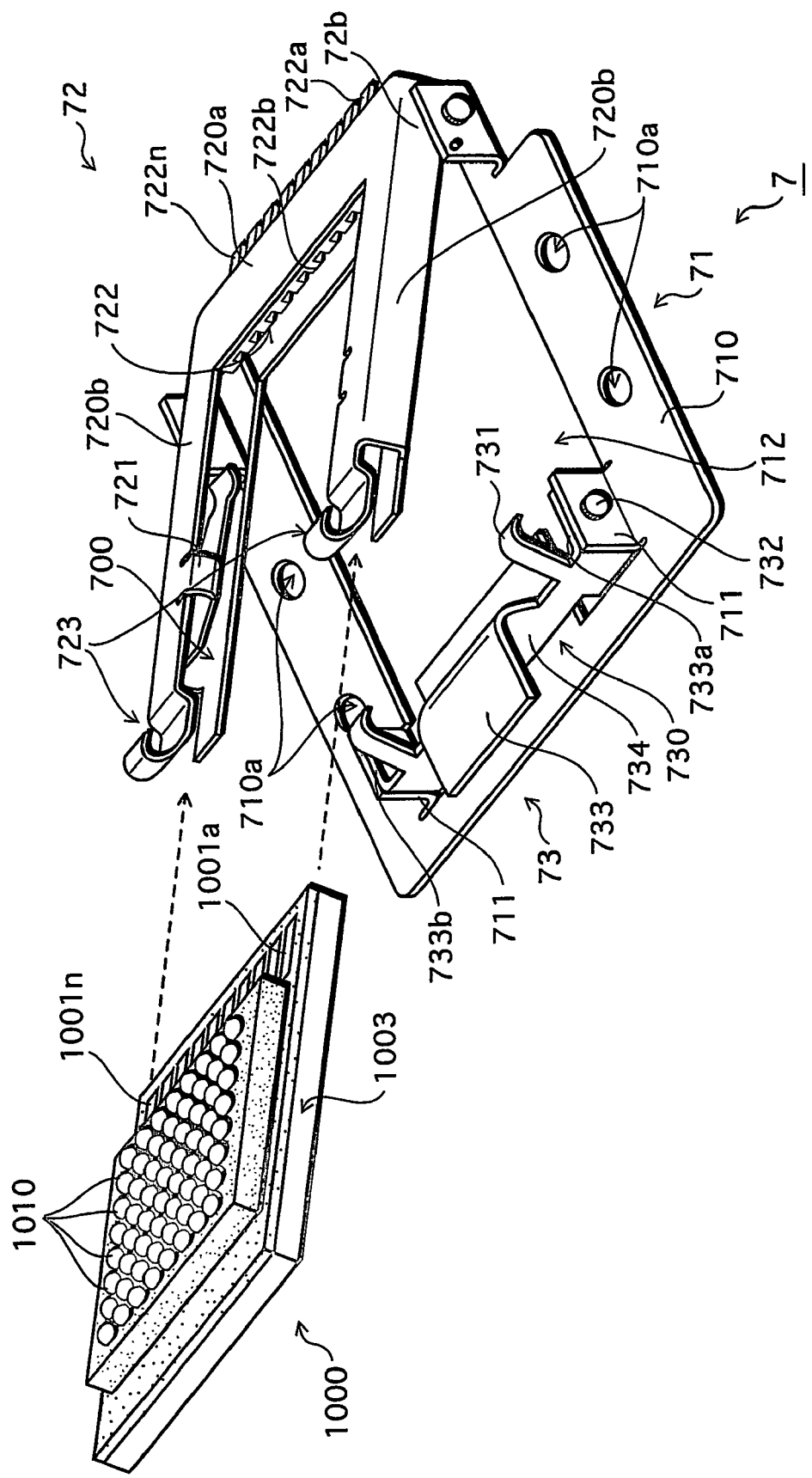
FIG. 11 shows the construction of an LED light-source socket relating to a seventh embodiment of the present invention.

FIG. 11 shows the construction of a socket 7 for an LED light source relating to the seventh embodiment.

The socket 7 relating to the seventh embodiment is characterized by its construction part including a lower member 71, which is different from that of the socket 6 relating to the sixth embodiment. The present embodiment is described focusing on the different construction part.

As shown in the figure, the lower member 71 includes a lower member main unit 710 that is a frame member in which a rectangular opening unit (base opening unit) 712 is formed. The size of the base opening unit 712 is set substantially equal to or larger than the size of the LED card 1000.

A lock unit 73 includes a pair of lock supporting parts 711, a hinge axis 732, and a lock main part 730. The lock main part 730 is supported by the lock supporting parts 711 on the hinge axis 732. The lock supporting parts 711 are rectangular parts formed by cutting the corresponding parts of the lower member main unit 610 and bending the cut parts so as to be perpendicular to the main surface of the lower member main unit 610. The two lock supporting parts 711 are positioned symmetric to each other with a certain distance between them. Due to this construction, the lock unit 73 bases its operation on the swinging motion described below.

The lock main part 730 is formed by processing a rectangular metal plate. The lock main part 730 includes a base part 734, a lock lever 733, and lock projections 731.

The base part 734 is a middle part of the lock main part 730. Both ends 733a and 733b of the base part 734 are supported on the hinge axis 732 in such a manner that the lock unit 73 can swing freely.

The lock lever 733 is formed by bending a top part of the lock main part 730 to extend from the base part 734 in L-shape. The lock lever 733 has such a size that allows the user to easily operate with his or her fingers.

The lock projections 731 are formed by bending top parts of the lock main part 730 to extend in L-shapes from both ends of the base part 734 in the direction opposite to the direction where the lock lever 733 extends. The lock projections 731 are formed to be directly engaged in lock catches 723 of the arm parts 720b of the upper member 72 when the socket 7 is in a closed state.

The lock main part 730 is positioned in such a manner that the engagement of the lock projections 731 and the lock catches 723 is positioned substantially right above the hinge axis 732 as viewed in the side surface direction of the socket 7. By this positioning, even if some troubles occur and the closed upper member 72 is mistakenly pressed up, the lock main part 730 locks the upper member 72 without being swayed by the force of such pressing-up. This positioning of the lock main part 730 aims at realizing secure locking.

It is preferable to provide the lock main part 730 with spring members equivalent to the springs 72b shown in FIG. 11, so that the lock unit 73 is pressed to sway in the bending direction of the lock protrusions 731. By doing so, the above locking effect can be improved further. On the contrary, the lock unit.73 may be pressed to swing in the direction opposite to the bending direction of the lock projections 731. By doing so, the upper member 72 can be more easily placed in an open state when the lock lever 733 is operated by the user.

7-2. Effect of the Socket 7

The socket 7 having the above-described construction is first fixed to a heat sink (3000 or the like) using screw holes 710a formed in the lower member 71. Here, it is preferable to place a heat-releasing sheet (equivalent to 613) in the surface area of the heat sink that is exposed through the base opening unit 713 of the lower member 71.

To mount the LED card 1000 onto the socket 7, the user inserts the LED card 1000 in the grooves of the arm parts 720b of the upper member 72 and slides the LED card 1000 in the same manner as that described in the sixth embodiment.

As in the sixth embodiment, the elastic contact units 721 of the arm parts 720b press the edge parts of the LED card 1000 in the direction where the lower member 71 is positioned, and also, the LED card 1000 is electrically connected via the external terminals 722a to 722n held by the terminal holding member 722. Further, the light source unit 1002 of the LED card 1000 is exposed through the opening unit 700.

In this state, the user then sways down the upper member 72, and lifts the lock lever 733 of the lock unit 73 toward the upper member 72 while pressing the upper member 72 against the lower member 71. Due to this, the lock unit 73 sways on the hinge axis 732, and the lock projections 731 are directly engaged in the lock catches 723 of the arm parts 720b of the upper member 72.

With this operation, the LED card 1000 set in the upper member 72 is fit in the base opening unit 712 of the lower member 71. The back surface of the LED card 1000 then faces the heat sink placed right below the lower member 71. Here, it is preferable to place a heat-releasing sheet on the surface of the heat sink, so that heat generated in the LED card 1000 can be released to the heat sink via the heat-releasing sheet. By doing so, a high heat-releasing effect can be produced. In the seventh embodiment, heat generated in the LED card 1000 can be released to the heat sink without making the LED card 1000 come in contact with the lower member 71. Therefore, a higher heat-releasing effect can be produced in the seventh embodiment than in the sixth embodiment.

Here, even without the heat-releasing sheet, a certain degree of heat-releasing effect can be produced because the LED card 1000 faces the heat sink with an extremely narrow gap between them (a gap substantially corresponding to the thickness of the lower member 71). It is however preferable to place the heat-releasing sheet, to obtain a higher heat-releasing effect.

To remove the LED card 1000, the user presses down the lock lever 733, so that the lock unit 73 sways up and its lock projections 731 are disengaged from the lock catches 723. With being unlocked, the upper member 72 is lifted up, and placed in an open state. In this state, the user can easily extract the LED card 1000.

According to the seventh embodiment as described above like in the sixth embodiment, the burden on the user replacing the LED card 1000 can be drastically alleviated as compared with conventional cases.

In the seventh embodiment, the lower member 71 has the base opening unit 713 formed therein. As compared with the sixth embodiment, therefore, a material used for the socket can be reduced by an amount corresponding to the base opening unit 713 in the seventh embodiment. The seventh embodiment is also advantageous in its low material cost.

By employing the socket 7 relating to the seventh embodiment for a lighting system, the lighting system can have a beautiful finish as in the sixth embodiment.

8. Eighth Embodiment 8-1. Construction of the Socket 8

Figure 12:
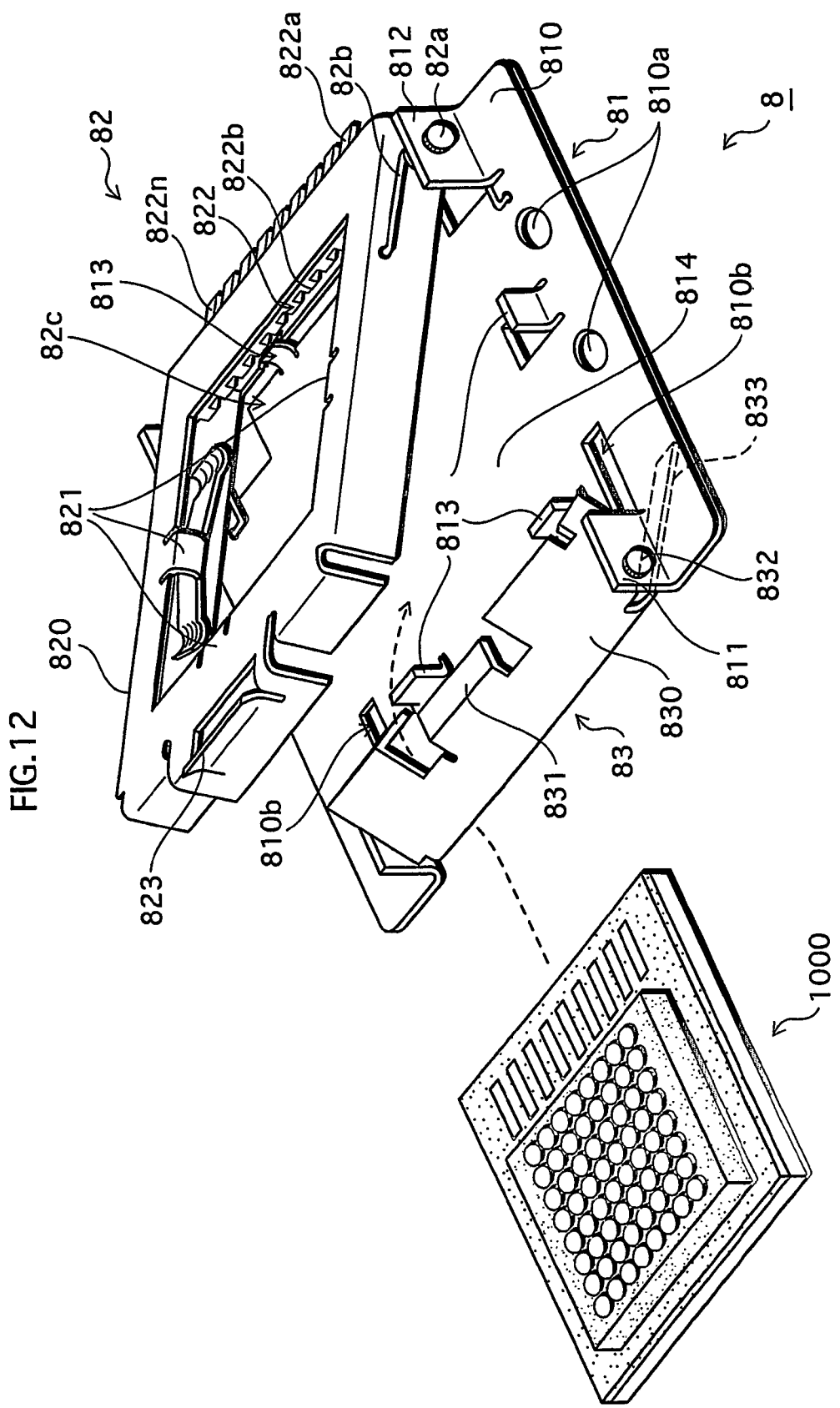
FIG. 12 shows the construction of an LED light-source socket relating to an eighth embodiment of the present invention.

FIG. 12 shows the construction of the socket 8 for an LED light source relating to the seventh embodiment.

For the sockets 6 and 7 relating to the sixth and seventh embodiments, the LED card 1000 is set in the grooves of the upper members 62 and 72. The socket 8 relating to the eighth embodiment differs from the sockets 6 and 7 relating to the sixth and seventh embodiments in that the LED card 1000 is set on a lower member 81. The following describes the socket 8, focusing on the construction part that is different from the constructions of the sockets 6 and 7.

The lower member 81 includes a lower member main unit 810, upper member supporting parts 812, and a lock unit 83. The lower member main unit 810 is a metal plate formed by nickel-plating brass with high heat conductivity. The upper member supporting parts 812 support the upper member 82.

Unlike in the case of the socket 7, the lower member main unit 810 is not a frame member in which a base opening unit is formed, but is a plate member. Instead, an area (card placement area) 814 in which an LED card is to be set is provided on the main surface of the lower member main unit 810. Also, a plurality of alignment projections 813 are formed on the main surface of the lower member main unit 810. The alignment projections 813 are formed by partially cutting the corresponding parts of the lower member main unit 810 and bending the cut parts so as to be perpendicular to the main surface of the lower member main unit 810. Further, a plurality of screw holes 810a are formed in the lower member main unit 810 to fix the lower member main unit 810 to a heat sink or the like.

The lock unit 83 includes a lock main part 830, a lock projection 831, and arm parts 833, etc.

The lock main part 830 is formed by processing a belt-shaped member. As shown in FIG. 12, both ends of the lock main part 830 in its longitudinal direction are supported by a pair of lock supporting parts 811 formed in the lower member main unit 810 in such a manner that the lock unit 83 can sway freely on a hinge axis 832.

The lock projection 831 is formed by bending a top part of the lock unit 83 to extend from the lock main part 830 in the direction where the card placement area 814 is positioned. The lock projection 831 is bent at such an angle that enables the lock projection 831 to be directly engaged in a lock catch 823 formed in the upper member 82.

The arm parts 833 are formed by cutting parts of the lock unit 83 into thin and long rectangular shapes to extend from both ends of the lock main part 830, and bending the cut parts in the direction where the card placement area 814 is positioned. It is preferable to set an angle at which the arm parts 833 are bent with respect to the lock main part 830 at 90° or larger. Notch parts 810b corresponding to the arm parts 833 are formed in the lower member main unit 810, so that the lock unit 83 can sway freely without its arm parts 833 being blocked by the lower member main unit 810.

On the other hand, the upper member 82 includes a rectangular frame-shaped main unit 820, and an external terminal unit 822.

The main unit 820 is formed by processing a plate member with high strength such as a stainless steel plate. The main unit 820 is a frame member in which a rectangular opening unit 82c is formed. Through the opening unit 82c, the light source unit 1002 of the LED card 1000 is exposed. The external terminal unit 822 having substantially the same construction as the external terminal units 622 and 722 is placed in the vicinity of one side of the rectangular opening unit 82c. On this side of the main unit 820, a hinge axis 82a is positioned. On the remaining three sides of the opening unit 82c, elastic contact units 821 having substantially the same construction as the elastic contact units 621 and 721 are formed by cutting the corresponding parts of the main unit 820 into T-shapes and bending the cut T-shaped parts inward.

The lock catch 823 is formed in the main unit 820 to face the lock unit 83 of the lower member 81, so that the lock catch 823 can directly engage therein the lock projection 831. The lock catch 823 is formed by cutting the corresponding part of the main unit 820 and bending the cut part.

8-2. Effect of the Socket 8

The socket 8 having the above-described construction is fixed to the surface of the heat sink (3000 or the like) using a plurality of screw holes 810a.

In this state, the user first opens the upper member 82, and then places the LED card 1000 on the card placement area 814 of the lower member 81. Here, in the socket 8, the LED card 1000 can be accurately aligned by the alignment projections 813 positioned to surround the card placement area 814, without being shifted to wrong positions. According to the eighth embodiment, therefore, the LED card 1000 can be placed accurately.

Figure 13A:
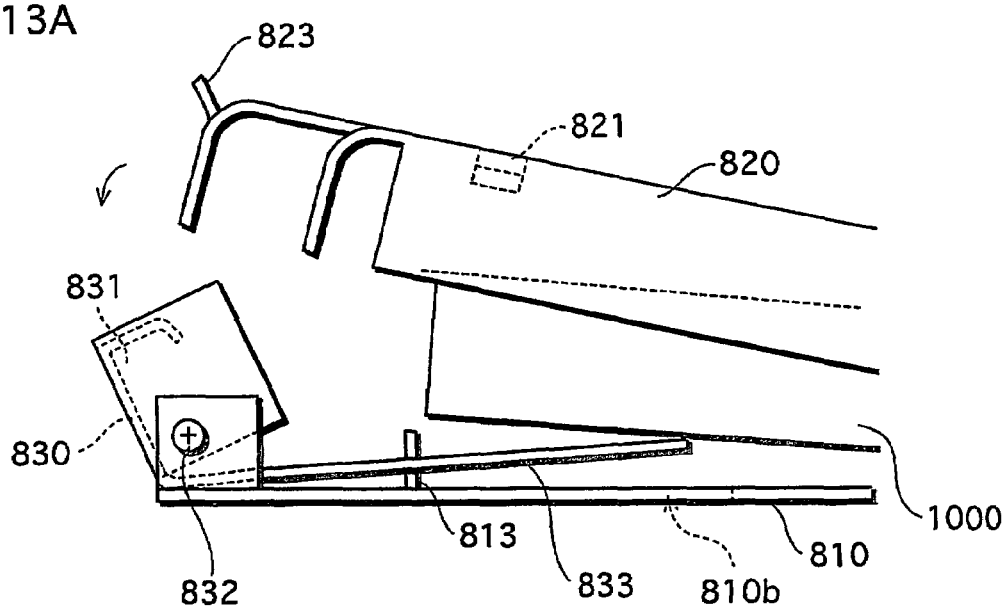
FIGS. 13A to 13C show side cross sectional views of the construction of the socket relating to the eighth embodiment.
Figure 13B:
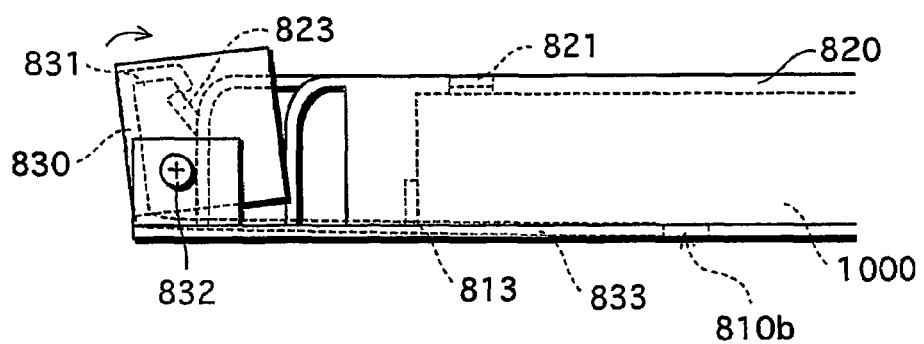
Figure 13C:
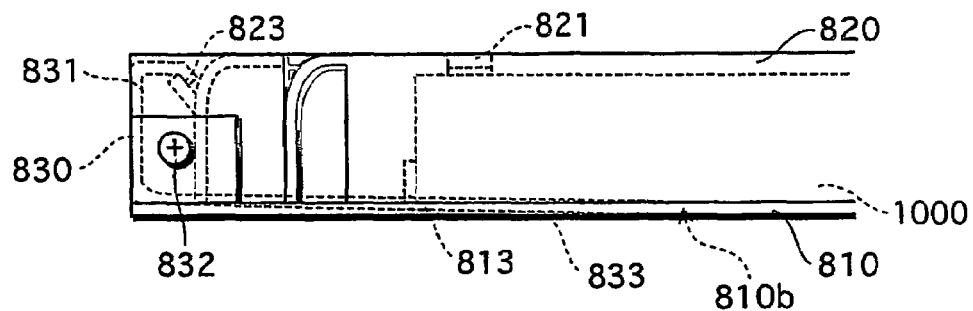

Further, the following effect can be produced in the eighth embodiment when the LED card 1000 is placed. FIGS. 13A to 13C show partial cross sections of the socket for explaining the effect.

As shown in FIG. 13A, the arm parts 833 formed at an angle of 90° or larger with respect to the lock main part 830 are away from the lower member main unit 810 in the upper direction when the LED card 1000 is not mounted. Because the arm parts 833 are formed integrally as parts of the lock unit 83, the lock main part 830 and the lock projection 831 are accordingly inclined outward.

Here, the lock unit 83 is pressed by springs (not shown) in such a direction that causes the tips of the arm parts 833 to be lifted up.

Then, the user inserts the LED card 1000 into the socket in such a manner that the LED card 1000 is surrounded by the alignment projections 813. As shown in FIG. 13B, the base surface of the LED card 1000 comes in contact with the arm parts 833, pressing down the arm parts 833. Along with this motion of the arm parts 833, the lock main part 830 is pressed up, and the lock catch 823 is moved to cover the upper member 82. The arm parts 833 are finally fit in the notch parts 810b formed in the lower member main unit 810, so that the arm parts 833 are parallel to the flat surface of the lower member main unit 810.

After this, the user presses down the lock projection 831 by fingers. With this user operation, the lock projection 831 is directly engaged in the lock catch 823 of the upper member main unit 820, thereby the upper frame 82 is locked on the lower frame 81. Due to this, the LED card 1000 is pressed against the lower member 81 by the elastic force produced by the elastic contact units 821 of the upper member 82 shown in FIG. 12. Via the lower member main unit 810, heat generated in the LED card 1000 can be favorably released to the heat sink. In the eighth embodiment, the lower member 81 is particularly made from a metal material with high heat conductivity, and the LED card 1000 comes in contact with the lower member 81. Therefore, an extremely high heat-releasing effect can be produced.

To remove the LED card 1000, the lock main part 830 is to be swayed in the direction opposite to the above swaying, so that the arm parts 833 are lifted up. Then, the LED card 1000 too is lifted up based on the principle of leverage. Accordingly, the user can easily remove the LED card 1000 from the socket 8 while being free from such a problem that the LED card 1000 may get stuck in the socket 8.

Further, because the LED card 1000 can be easily mounted on and removed from this socket 8, the burden on the user relating to the replacement operation of the LED card 1000 can be drastically alleviated. Also, by employing the socket 8 for a lighting system, the lighting system can have good heat-releasing properties and good replacement operability without any disfigurement, as in the case of the sway-type sockets 6 and 7 relating to the sixth and seventh embodiments.

9. Ninth Embodiment 9-1. Construction of the Socket 9

Figure 14:
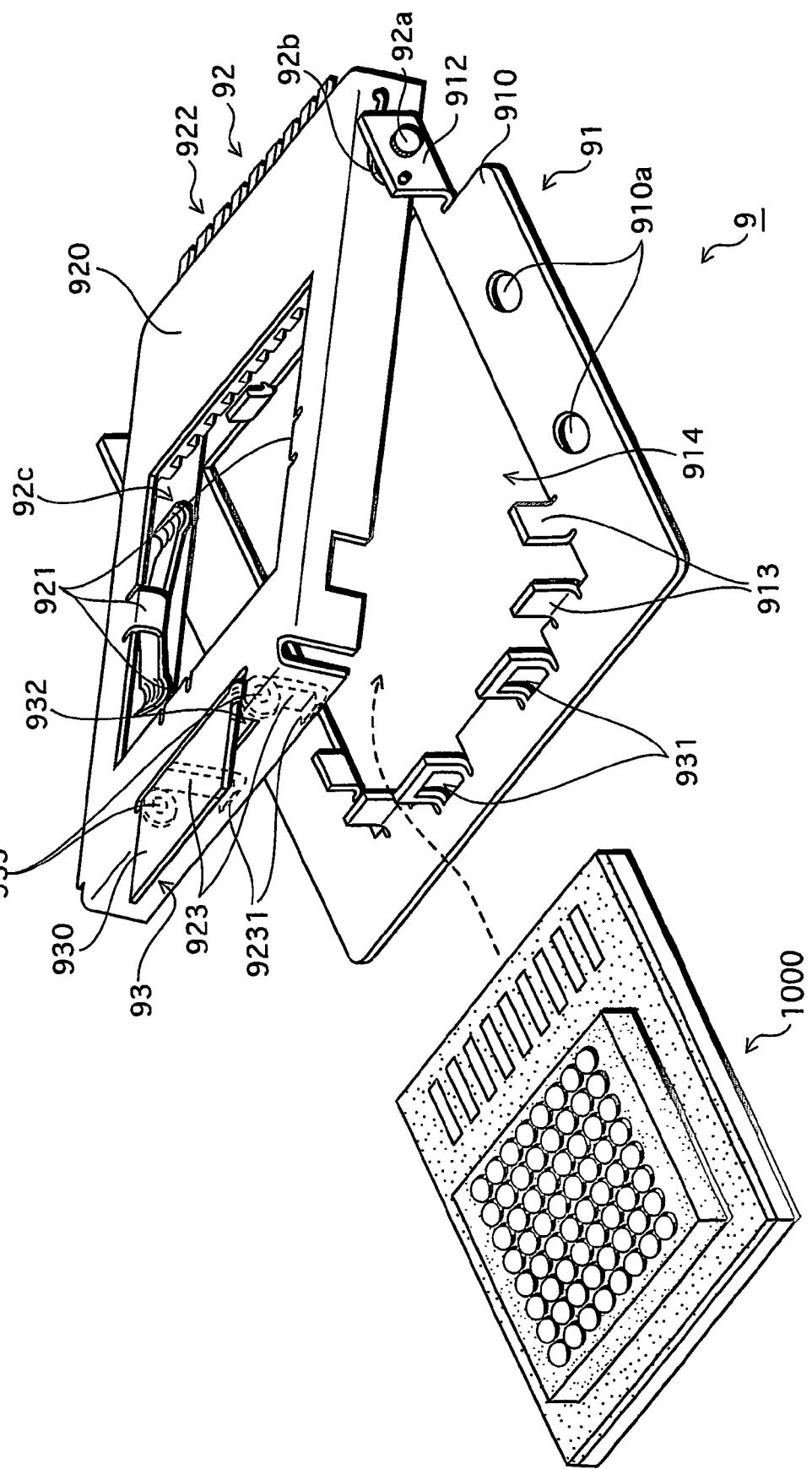
FIG. 14 shows the construction of an LED light-source socket relating to a ninth embodiment of the present invention.

FIG. 14 is a perspective view of a socket 9 for an LED light source relating to a ninth embodiment of the present invention.

The socket 9 is the same as the socket 8 relating to the eighth embodiment in that a lower member 91 has alignment projections 913 for aligning the LED card 1000. The socket differs from the socket 8 in that a base opening unit 914 corresponding to the size of the LED card 1000 is formed in the lower member 91 instead of the card placement area 814.

Also, the socket 9 is characterized in that a lock unit 93 is provided not on the lower member 91 but on an upper member 92.

To be more specific, the lower member 91 includes a lower member main unit 910 formed by processing a metal plate into a rectangular frame shape. The lower member main unit 910 has, in the vicinity of the rectangular base opening unit 914 formed therein, a pair of upper member supporting parts 912, a plurality of alignment projections 913, and a plurality of lock catches 931, which are formed by cutting and bending the corresponding parts of the lower member main unit 910. Reference numeral 92a in FIG. 14 represents a hinge axis, which is the same as the hinge axis described in the above embodiments, provided in each of the upper member supporting parts 912. In the lock catches 931, rectangular holes in which lock projections can be fit are formed.

The upper member 92 has a rectangular opening unit 92c through which the light source unit 1002 of the LED card 1000 is exposed, an external terminal unit 922, and the lock unit 93. At the upper member supporting parts 912, the upper member 92 and the lower member 91 are combined together on the hinge axis 92a.

The lock unit 93 includes a lock lever 930, the lock projections 923, and a hinge axis 933. The lock unit 93 is positioned to face the external terminal unit 922 placed in the vicinity of the rectangular opening unit 92c formed in the upper member main unit 920.

The lock lever 930 and the lock projections 923 are formed by cutting and bending the corresponding parts of one metal plate. The lock lever 930 may be formed, for example, as a flat rectangular plate. The two lock projections 923 may be formed to extend like arms from both ends of the lock lever 930 by bending the corresponding parts at right angles.

At the tips of the lock projections 923, lock hooks 9231 to be engaged in the lock catches 931 are formed.

The lock lever 930 with the lock projections 923 is supported on the hinge axis 933 provided at inner both ends of the opening unit 92c of the upper member 92 in such a manner that the lock lever 930 can freely sway. Here, the lock lever 930 is positioned to externally extend from the upper member main unit 922. The lock projections 923 are positioned at the inner side of the upper member main unit 922. It should be noted here that the hinge axis 933 has a coil spring (not shown) that normally applies pressures in such a direction that causes the lock lever 930 to be lifted up.

9-2. Effect of the Socket 9

The socket 9 having the above-described construction is fixed to the heat sink using screw holes 910a.

To mount the LED card 1000, the user first opens the upper member 92 by lifting it up, and then places the LED card 1000 to be aligned with the base opening unit 914 of the lower member 91. Here, as in the case of the socket 8, the LED card 1000 can be accurately aligned on the lower member 91 of the socket 9 by the alignment projections 913. The LED card 1000 can be accurately aligned by the alignment projections 913 without being shifted to wrong positions.

Following this, the user closes the upper member 92 by pressing the lock lever 930 of the lock unit 93. While maintaining the closed state, the user releases the pressing of the lock lever 930. Due to this, the lock lever 930 is lifted up by the force of the coil spring, and the lock hooks 9231 at the tips of the lock projections 923 are directly engaged in the lock catches 931 of the lower member 71. It should be noted here that the upper member 92 can also be manually lifted up easily without using the coil spring.

With this construction, the socket 9 relating to the ninth embodiment can produce substantially the same effect as the effect produced by the socket 8 relating to the eighth embodiment. Further, the ninth embodiment is characterized in that the base opening unit 914 is formed in the lower member main unit 910. Therefore, the LED card 1000 can be accurately aligned by the alignment projections 913 and heat generated in the LED card 1000 can be directly released to the heat sink placed on the lower member 71. Therefore, a relatively high heat-releasing effect can be produced.

To remove the LED card 1000, the user presses the lock lever 930 so that the lock unit 93 sways and the lock projections 923 are easily disengaged from the lock catches 931. Due to this, the upper member 92 is lifted up, and the LED card 1000 can be removed. In this way, the replacement operability of the LED card 1000 for the user can also be improved.

Also, by employing the socket 9 for a lighting system, the lighting system can have good heat-releasing properties and good replacement operability without any disfigurement as in the sixth and eighth embodiments.

10. Additional Matters

Although the above embodiments describe the case where the LED card 1000 is formed by integrating an 8 by 8 matrix of 64 LED elements, the present invention should not be limited to this card construction. The LED card 1000 may have other card constructions such that a 5 by 5 matrix of 25 LED elements are integrated.

Further, the dimensions of the LED card and the socket should not be limited to those described in the above embodiments, but maybe changed appropriately. The thickness of the LED card should not be limited to 1.2 mm employed in the above embodiments, but may be for example in a range of 1.0 to 1.5 mm.

Also, the present invention is expected to produce a high effect when the back surface of the LED card is flat and can easily come in contact with the heat sink. Such an LED card whose back surface is flat is often constructed by using bare chips. However, the present invention should not be limited to the LED card using bare chips but can be applied to LED cards using other types of LED elements (e.g., surface mount device type). In the case of the LED cards using the other types of LED elements, too, a certain level of effect can be produced.

Further, the above embodiments describe the case where the LED card 1000 having the metal layer 1031 is used. This construction is preferable to improve the mechanical strength of the LED card 1000 for the purpose of making the back surface of the LED card 1000 come in contact with the heat sink 3000 when, as one example, the elastic pressing units 14R, 14L, and 14C at the edge vicinities of the opening unit 1000 press the edges of the light source unit 1002 in the socket 1 relating to the first embodiment.

The metal layer 1031 may not be included in the LED card to be set in the socket etc., of the present invention. It is however preferable to employ the metal layer 1031, to obtain favorable heat-releasing properties and mechanical strength of the LED card 1000.

It is preferable that the entire back surface of the LED card comes in contact with the heat sink or with the lower member. However, a certain level of effect can be produced even when the back surface of the LED card only partially comes in contact with the heat sink or with the lower member.

Further, it is preferable that the LED light-source socket described in the above embodiments includes a detector for detecting the setting of the LED card 1000. The detector is pressed by the LED card 1000 when the LED card 1000 is set in the socket. Only when the detector detects the setting of the LED card 1000, power is supplied from the external terminals to the LED card 1000. With the use of such a detector, the user can replace the LED card 1000 safely, without worrying about touching the external terminals during the replacement operation.

Alternatively, recessions may be formed in parts of the LED card 1000 other than the parts corresponding to the light source unit 1002 and the feeding terminals 1001*a* to 1001*n*. By doing so, the setting of the LED card 1000 can be detected by the tactile feedback sensed when the elastic pressing members of the socket are fit into the recessions.

Further, notches may be formed in the corners of the LED card 1000, and projections corresponding to the notches may be formed in the socket, to prevent erroneous insertion of the LED card 1000.

Moreover, the lock unit described in the sixth to ninth embodiments may be provided in either the upper member or the lower member as long as the upper member and the lower member can be locked via the lock unit.

INDUSTRIAL APPLICATION

The present invention is applicable to lighting apparatuses and lighting systems that are required to have a feature of being compact, thin, lightweight or the like.

The invention claimed is:

1. A card-type LED light source socket to be fixed to a heat sink and with a removable card-type LED module held therein and having a light source unit on a main surface of the LED module thereof, the light source unit being formed by integrated LED elements, the LED light source socket comprising:
    a frame structure for holding the LED module in a state where the light source unit is exposed through an opening in the frame structure;
    a plurality of socket feeding terminals that abut a feed pattern of the LED module to supply power thereto by pressing the feed pattern in a direction such that a back surface of the LED module is pressed directly against a surface of the heat sink; and
    a pressing unit that has elasticity, is at such a position facing the LED module on a surface of the frame structure, and presses a peripheral part of the LED module in the direction.

2. The socket of claim 1 wherein the frame structure is metal.

3. The socket of claim 1 wherein the frame structure has a U-shape with the opening on a main surface.

4. The socket of claim 1 wherein the opening constitutes a majority of a main surface of the frame structure to accommodate an array of LEDs as the light source.

5. The socket of claim 1, wherein
    the frame structure has a slot area through which the LED module is removably inserted therein, and a cutout area that is formed to spatially connect the slot area and the opening, for guiding the light source unit to the opening in the frame structure when the LED module is inserted.

6. The socket of claim 1, wherein
    the pressing member is formed integrally as a part of the frame structure.

7. The socket of claim 1, wherein
    the frame structure includes a lower frame-part and an upper frame-part, the lower frame-part configured to be in contact with the heat sink when mounted thereon, the upper frame-part for holding the LED module and being fixed to the lower frame-part, and a pressing member that has elasticity and is provided on the upper frame-part, wherein
    the pressing member presses the LED module against a surface of the lower frame-part, when the lower frame-part is fixed in contact with the surface of the heat sink.

8. The socket of claim 1, wherein
    a pressure which is applied by at least the pressing unit to the LED module is in a range of 0.05 to 1.00 kg/cm² inclusive.

9. The socket of claim 1, wherein
    socket feeding terminal is provided at a position that would face the LED module on the frame structure,
    the socket feeding terminal includes a plurality of electrical contacts made of phosphor bronze, that are mounted so that an elastic force of the electrical contacts presses the LED module against the heat sink.

10. The socket of claim 1, wherein
    the socket is configured to be fixed to the heat sink via a screw.

11. A lighting system comprising:
    the socket of claim 1;
    a card-type LED module set in the socket; and
    a heat sink.

12. A socket for holding a card-type LED module on a heat sink, the LED module having a light source unit on a main surface thereof, the LED module being formed by integrated LED elements, the socket comprising:
    a frame structure including a lower frame-part and an upper frame-part, the lower frame-part configured to be placed on the heat sink, the upper frame-part configured for holding the LED module in a state where the light source unit is exposed through an opening of the frame;
    a hinge, wherein the upper frame-part is supported by the lower frame-part via the hinge in such a manner that the upper frame-part can be opened and closed,
    the upper frame-part includes a pressing unit for pressing any LED module mounted in the socket against the lower frame-part; and
    a lock unit for locking the upper frame-part when the upper frame-part is closed to the lower frame-part.

13. The socket of claim 12, wherein
    the upper frame-part includes a base part and a pair of arm parts, the base part being supported on an axis in an area where the upper frame-part is supported by the lower frame-part, the pair of arm parts respectively extending from both ends of the base part,
    the arm parts have grooves formed at facing positions thereof, for guiding edge parts of the LED module in a longitudinal direction of the arm parts, and
    the pressing unit of the upper frame-part is formed within the grooves to press the edge parts of the LED module against the lower frame-part in a state where the LED module is held in the grooves.

14. The socket of claim 12, wherein
    a heat-releasing sheet is provided on a surface of the main part of the lower frame-part facing the LED module.

15. The socket of claim 12, wherein
    the opening is formed in the main part of the lower frame-part for enabling a base surface of the LED module to face the heat sink.

16. The socket of claim 13, wherein
the lock unit has a slide part placed to be slidable in a longitudinal direction of the arm parts when the upper frame-part is closed, and
the slide part locks edges of the LED module held by the arm parts when the upper frame-part is closed, thereby the upper frame-part is indirectly locked.

17. The socket of claim 12, wherein
the lock unit is supported on an axis in a freely swayable manner, at a position opposite to a position of the hinge between the lower frame-part and the upper frame-part, and
the lock unit sways toward the upper frame-part when the upper frame-part is closed, thereby the upper frame-part is directly locked on the lower frame-part.

18. The socket of claim 17, wherein
an area of locking between the lock unit and the upper frame-part is positioned above the axis on which the lock unit is supported in a freely swayable manner.

19. The socket of claim 12, wherein
the lower frame-part has a projection for aligning the LED module.

20. The socket of claim 17, wherein
the lower frame-part has a plurality of projections for aligning the LED module, the projections being positioned so as to surround the LED module, and
a base opening is formed in an area surrounded by the projections, for enabling a base surface of the LED module to face the heat sink.

21. The socket of claim 12, wherein
the pressing unit is formed integrally as a part of the upper frame-part.

22. A lighting system comprising:
the socket of claim 12; and
a case for fixing the socket.

* * * * *